(12) United States Patent
Kuo et al.

(10) Patent No.: US 12,176,321 B2
(45) Date of Patent: Dec. 24, 2024

(54) SEMICONDUCTOR PACKAGES AND METHOD OF FORMING THE SAME

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Chia-Wei Wang, Hsinchu (TW); Yu-Tzu Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 55 days.

(21) Appl. No.: 17/218,171

(22) Filed: Mar. 31, 2021

(65) Prior Publication Data

US 2022/0320039 A1    Oct. 6, 2022

(51) Int. Cl.
*H01L 23/00* (2006.01)
*H01L 23/538* (2006.01)
*H01L 25/065* (2023.01)
*H01L 27/06* (2006.01)

(52) U.S. Cl.
CPC .......... *H01L 24/82* (2013.01); *H01L 23/5384* (2013.01); *H01L 24/80* (2013.01); *H01L 24/95* (2013.01); *H01L 25/0657* (2013.01); *H01L 27/0688* (2013.01); *H01L 2224/80896* (2013.01)

(58) Field of Classification Search
CPC ......... H01L 23/00; H01L 21/78; H01L 24/82; H01L 23/5381; H01L 23/5389; H01L 2224/80896; H01L 25/0657; H01L 25/043; H01L 25/074; H01L 25/0756; H01L 25/117; H01L 2224/08145; H01L 21/187; H01L 2224/8002; H01L 2224/05567; H01L 2224/8082; H01L 2224/04026; H01L 2224/83894–83896
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |

(Continued)

*Primary Examiner* — Nelson Garces
*Assistant Examiner* — Quinton A Brasfield
(74) *Attorney, Agent, or Firm* — JCIPRNET

(57) ABSTRACT

A method of forming a semiconductor package includes the following operations. A first integrated circuit structure is provided, and the first integrated circuit structure includes a first substrate and a silicon layer over the first substrate. A plasma treatment is performed to transform a top portion of the silicon layer to a first bonding layer on the remaining silicon layer of the first integrated circuit structure. A second integrated circuit structure is provided, and the second integrated circuit structure includes a second substrate and a second bonding layer over the second substrate. The second integrated circuit structure is bonded to the first integrated circuit structure through the second bonding layer of the second integrated circuit structure and the first bonding layer of the first integrated circuit structure.

20 Claims, 14 Drawing Sheets

(56) References Cited

U.S. PATENT DOCUMENTS

| | | | |
|---|---|---|---|
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0094661 A1* | 7/2002 | Enquist | H01L 21/8221 257/E21.705 |
| 2008/0318394 A1* | 12/2008 | Kakehata | H01L 21/76254 257/E21.211 |
| 2012/0276301 A1* | 11/2012 | Lee | H01L 21/76826 427/535 |
| 2013/0153093 A1* | 6/2013 | Vandroux | H01R 43/02 228/175 |
| 2013/0252399 A1* | 9/2013 | Leduc | H01L 21/0226 438/455 |
| 2017/0301646 A1* | 10/2017 | Kim | H01L 24/83 |
| 2018/0082976 A1* | 3/2018 | Edelstein | H01L 24/03 |
| 2020/0013754 A1* | 1/2020 | Gao | H01L 25/0652 |
| 2020/0328180 A1* | 10/2020 | Cheng | H01L 25/18 |
| 2021/0057332 A1* | 2/2021 | Chen | H01L 21/76807 |
| 2022/0077105 A1* | 3/2022 | He | H01L 24/80 |
| 2022/0093564 A1* | 3/2022 | Chen | H01L 25/18 |
| 2022/0285303 A1* | 9/2022 | Mirkarimi | H01L 24/05 |

* cited by examiner

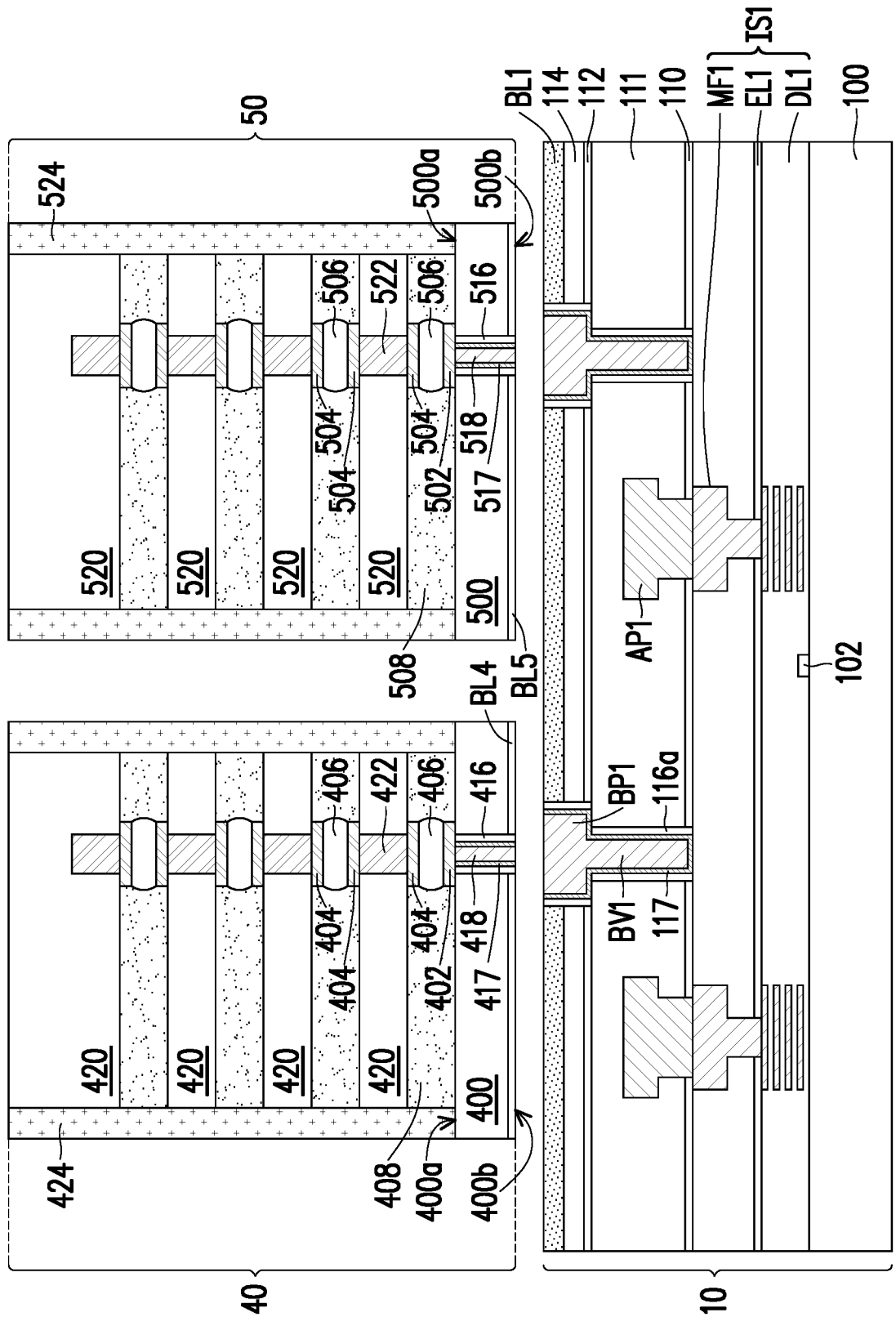

SEMICONDUCTOR PACKAGES AND METHOD OF FORMING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3D are cross-sectional views of a method of forming a semiconductor package in accordance with alternative embodiments.

DETAILED DESCRIPTION

Figure 1A:
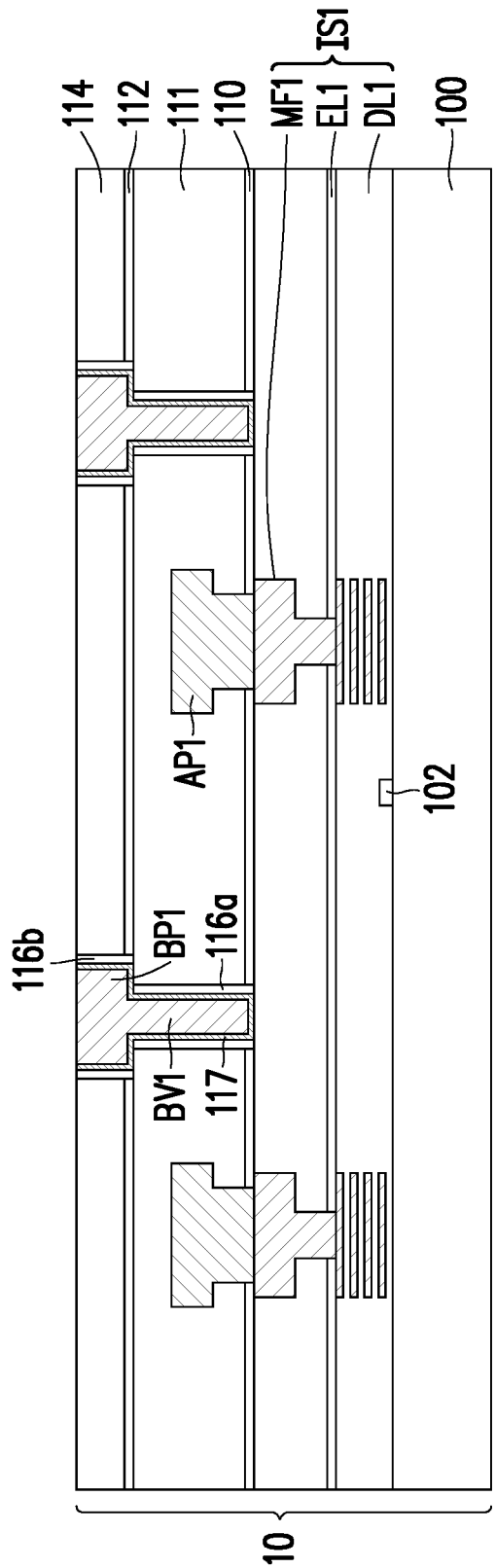
FIG. 1A to FIG. 1D are cross-sectional views of a method of forming a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1D are cross-sectional views of a method of forming a semiconductor package in accordance with some embodiments. It is understood that the disclosure is not limited by the method described below. Additional operations can be provided before, during, and/or after the method and some of the operations described below can be replaced or eliminated, for additional embodiments of the methods.

Referring to FIG. 1, an integrated circuit structure 10 is provided. The integrated circuit structure 10 may be an application-specific integrated circuit (ASIC) chip, an analog chip, a sensor chip, a wireless and radio frequency chip, a voltage regulator chip or a memory chip, for example. In some embodiments, the integrated circuit structure 10 includes a substrate 100, an interconnect structure IS1, conductive pads AP1 and a passivation layer 111.

The substrate 100 includes an elementary semiconductor such as silicon, germanium and/or a compound semiconductor such as silicon germanium, silicon carbide, gallium arsenic, indium arsenide, gallium nitride or indium phosphide. In some embodiments, the substrate 100 includes a silicon-containing material. For example, the substrate 100 is a silicon-on-insulator (SOI) substrate or a silicon substrate. The silicon substrate includes a single-crystalline silicon substrate, an amorphous silicon substrate, a polysilicon substrate or a combination thereof. In various embodiments, the substrate 100 may take the form of a planar substrate, a substrate with multiple fins, nanowires, or other forms known to people having ordinary skill in the art. Depending on the requirements of design, the substrate 100 may be a P-type substrate or an N-type substrate and may have doped regions therein. The doped regions may be configured for an N-type device or a P-type device. In some embodiments, the substrate 100 may have through substrate vias (not shown) therein upon the process requirements.

The substrate 100 includes isolation structures defining at least one active area, and at least one device 102 is disposed in the active area. The at least one device 102 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the device 102 includes a gate dielectric layer, a gate electrode, source/drain regions, spacers, and the like. In some embodiments, the integrated circuit structure 10 is referred to as a "first device die" through the specification.

The interconnect structure IS1 is disposed over a first side (e.g., front side) of the substrate 100. Specifically, the interconnect structure IS1 is disposed over and electrically connected to the device 102. In some embodiments, the interconnect structure IS1 includes dielectric layers DL1 and metal features MF1. The metal features MF1 are disposed in the dielectric layers DL1 and electrically connected with each other. Portions of the metal features MF1 are exposed by the topmost dielectric layer DL1. In some embodiments, each dielectric layer DL1 includes silicon oxide, silicon oxynitride, silicon nitride, a low dielectric constant (low-k) material having a dielectric constant less than 3.5, or a combination thereof. In some embodiments, the metal features MF1 include metal plugs and metal lines. The plugs may include contacts formed in the inter-layer dielectric layer, and vias formed in the inter-metal dielectric layer. The contacts are formed between and in contact with a bottom metal line and the underlying device 102. The vias are formed between and in contact with two metal lines. Each metal feature MF1 may include tungsten (W), copper (Cu), a copper alloy, aluminum (Al), an aluminum alloy or a combination thereof. In some embodiments, a barrier layer may be disposed between each metal feature MF1 and the dielectric layer DL1 to prevent the material of the metal feature MF1 from migrating to the underlying device 102. The barrier layer may include Ta, TaN, Ti, TiN, CoW or a combination thereof. A seed layer may be optionally formed between each metal feature and the barrier layer. The seed layer may include Cu, Ag or the like. In some embodiments, the interconnect structure IS1 further includes an etching stop layer EL1 between two adjacent metal features and/or two adjacent dielectric layers. The etching stop layer EL1 may include SiN, SiC, SiCN, AlN, $Al_2O_3$ or a combination thereof. In some embodiments, the interconnect structure IS1 is formed by a dual damascene process. In alternative embodiments, the interconnect structure IS1 is formed by multiple single damascene processes. In yet alternative embodiments, the interconnect structure IS1 is formed by an electroplating process.

The conductive pads AP1 are formed over and electrically connected to the interconnect structure IS1. The conductive pads AP1 may be aluminum-containing pads. In some embodiments, some of the conductive pads AP1 have probe marks on the surfaces thereof. In other words, the integrated circuit structure 10 is a "known good die". In alternative embodiments, the conductive pads AP1 are free of probe marks.

The passivation layer 111 is formed over the interconnect structure IS1 and covers the conductive pads AP1. In some embodiments, the passivation layer 111 includes silicon oxide, silicon nitride, benzocyclobutene (BCB) polymer, polyimide (PI), polybenzoxazole (PBO) or a combination thereof, and is formed by a suitable process such as spin coating, CVD or the like. In some embodiments, the passivation layer 111 is formed after the testing process is performed.

The passivation layer 111 may have a multi-layer structure. In some embodiments, the passivation layer 111 includes a lower passivation layer laterally aside the sidewall of the lower portion of each conductive pad AP1, and an upper passivation layer disposed on the lower passivation layer and covering the sidewall and top surface of the upper portion of the conductive pad AP1. The lower and upper passivation layers may be formed of the same material or different materials. In some embodiments, an etching stop layer 110 is formed between each conductive pad AP1 and the underlying topmost metal feature MF1. The etching stop layer 110 may include SiN, SiC, SiCN, AlN, $Al_2O_3$ or a combination thereof.

In some embodiments, the integrated circuit structure 10 further includes a silicon layer 114 over the passivation layer 111. In some embodiments, the silicon layer 114 includes substantially pure silicon. For example, the silicon layer 114 has a silicon content of about 90 at %, 95 at % or more. In some embodiments, the silicon layer 114 includes an amorphous silicon layer. In alternative embodiments, the silicon layer 114 is a polysilicon layer. In yet alternative embodiments, the silicon layer 114 is a single-crystalline silicon layer. In some embodiments, the silicon layer 114 a single layer. In other embodiments, the silicon layer 114 is a multi-layer structure including at least two materials selected from amorphous silicon, polysilicon and single-crystalline silicon. In some embodiments, the silicon layer 114 is an un-doped silicon layer. In some embodiments, the silicon layer 114 is a nitrogen free layer. In some embodiments, the silicon layer 114 is an oxygen free layer. The silicon layer 114 may be formed by a suitable method, such as CVD or the like. In some embodiments, the silicon layer 114 has a thickness ranging from 0.2 um to 5 um.

In some embodiments, the integrated circuit structure 10 further includes bonding features BF1. In some embodiments, each bonding feature BF1 includes a bonding pad, a bonding via, a through substrate via or a combination thereof. In some embodiments, as shown in FIG. 1A, each bonding feature BF1 includes a bonding via BV1 embedded in the passivation layer 111 and an overlying bonding pad BP1 embedded in the silicon layer 114. Each bonding feature BF1 may include tungsten (W), copper (Cu), a copper alloy, aluminum (Al), an aluminum alloy or a combination thereof. In some embodiments, a barrier layer 117 is formed between each bonding feature BF1 and the adjacent film layer (e.g., the passivation layer 111 and/or the silicon layer 114) to prevent the material of the bonding feature BF1 from migrating to the underlying device 102. The barrier layer may include Ta, TaN, Ti, TiN, CoW or a combination thereof. A seed layer may be optionally formed between each bonding feature and the barrier layer. The seed layer may include Cu, Ag or the like. In some embodiments, an etching stop layer 112 is formed between two adjacent bonding features BF1 and/or two adjacent film layers. The etching stop layer 112 may include SiN, SiC, SiCN, AlN, $Al_2O_3$ or a combination thereof. In some embodiments, the bonding features BF1 are formed by a dual damascene process. In alternative embodiments, the bonding features BF1 are formed by multiple single damascene processes. In yet alternative embodiments, the bonding features BF1 are formed by an electroplating process.

In some embodiments, an insulating liner is formed between each bonding feature BF1 and the adjacent film layer (e.g., the passivation layer 111 and/or the silicon layer 114) to electrically insulate each bonding feature from the adjacent film layer. In some embodiments, an insulating liner 116a is formed between the bonding via BV1 and the passivation layer 111, and an insulating liner 116b is formed between the bonding pad BP1 and the silicon layer 114. The insulating liner may include silicon oxide or the like. In some embodiments, the insulating liner 116a is optional and may be omitted as needed.

Figure 1B:
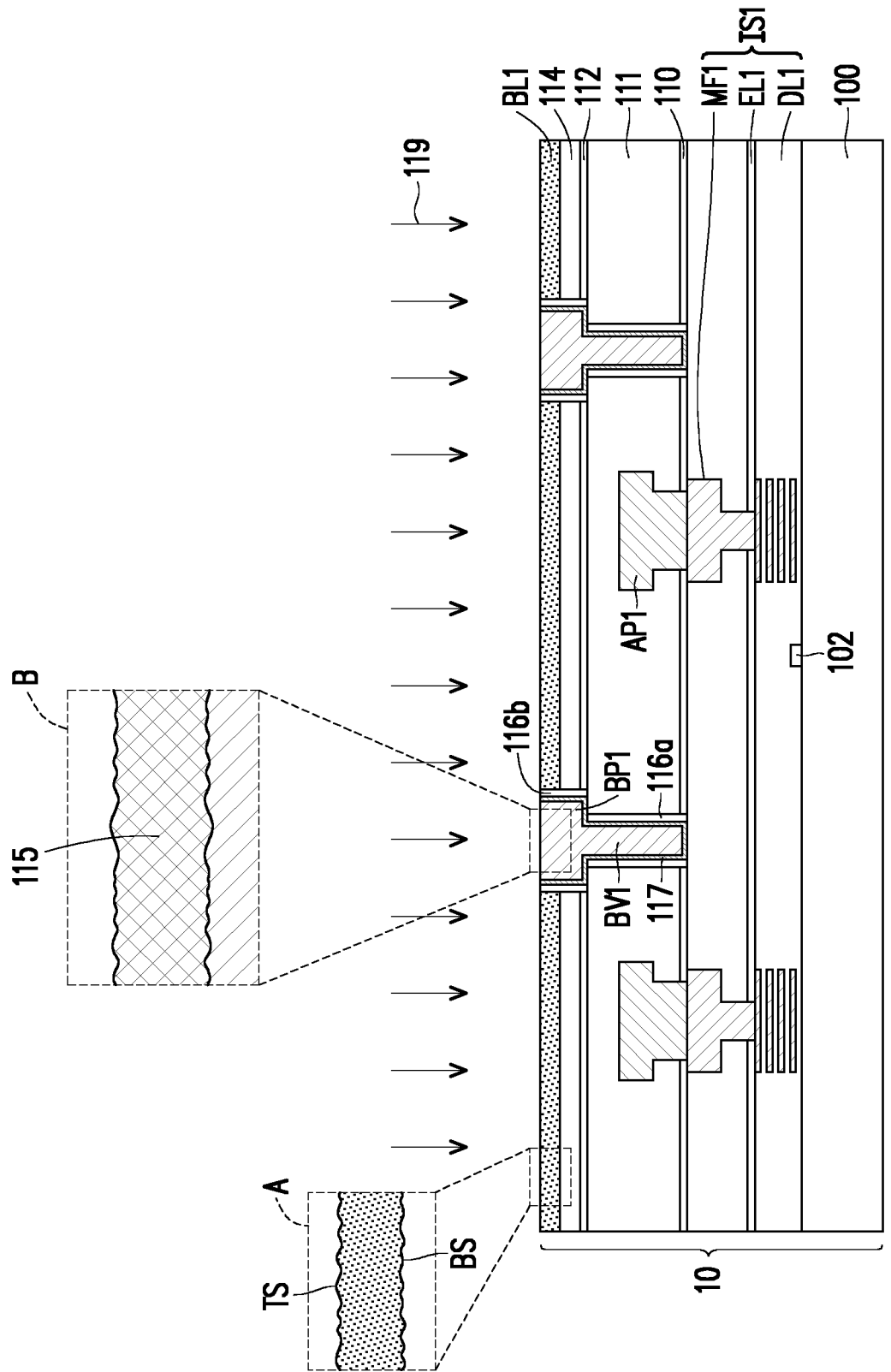

Referring to FIG. 1B, a plasma treatment 119 is performed to transform a top portion of the silicon layer 114 to a bonding layer BL1 on the remaining silicon layer 114 of the integrated circuit structure 10. In some embodiments, the plasma treatment 119 is a nitrogen-containing plasma. The operation in FIG. 1B may be referred to as a nitridation process, a nitrogen treatment, a plasma nitridization procedure or a nitrogen plasma implantation in some examples. Specifically, the plasma treatment 119 is performed to the silicon layer 114, and thus, the bonding layer BL1 is formed on the top portion of the silicon layer 114. In some embodiments, the bonding layer BL1 is in physical contact with the insulating layer 116b aside the bonding pad BP1.

In some embodiments, the plasma treatment 119 includes $N_2$, $NH_3$, $NH_4$, NHx (wherein x is between 0 and 1), the like or a combination thereof. In some embodiments, the plasma treatment 119 is a pure nitrogen gas. In alternative embodiments, the nitrogen-containing ambient may be diluted with an inert gas such as, for example, argon (Ar), helium (He), neon (Ne), or a mixture thereof. In some embodiments, the amount of the nitrogen-containing gas is greater than the amount of the inert gas, so as to effectively form the bonding layer BL1. In some embodiments, the nitrogen amount accounts for more than about 50 vol % (e.g., 70-90 vol %) of the total gas amount. In some embodiments, the plasma treatment 119 includes a dilute gas (e.g., argon) and a nitrogen-containing gas (e.g., nitrogen), and the volume ratio of the dilute gas to the nitrogen-containing gas ranges from about 1:1 to about 1:10, such as 1:2, 1:3, 1:4, 1:5, 1:6, 1:7, 1:8, 1:9 or 1:10, including any range between any two of the preceding values. The volume ratio of the dilute gas to the nitrogen-containing gas may be less than any one of the preceding values.

In some embodiments, the surface portion of the exposed silicon layer 114 is reacted with nitrogen to form a silicon nitride layer as a bonding layer. In some embodiments, the surface portion of each exposed bonding feature BF1 (e.g., bonding pad BP1) may be reacted with nitrogen to form a nitridized metal portion 115 (as shown in the enlarged view B). In some embodiments, the nitridized metal portion 115 is as thick as or thinner than the adjacent bonding layer BL1. The nitridized metal portion 115 is too thin to affect the subsequently bonding performance.

Besides, the plasma reactor control parameters (such as chamber temperature, process time, power, chamber pressure, gas flow rate and the like) may be selected before processing the plasma treatment 119. In some embodiments, the plasma treatment 119 includes a chamber temperature of −20 to 100° C. (e.g., 15-70° C. or 20-30° C.), a process time to 10 to 3,600 seconds (e.g., 60-600 seconds), a power of 200 to 2,000 W (e.g., 300-700 W), a nitrogen flow rate of 20 to 2,000 sccm (e.g., 200-800 sccm), and a chamber pressure of 1 to 100 Pa (e.g., 5-50 pa).

In some embodiments, the bonding layer BL1 has a nitrogen atom content of about 10-60 at %, such as 20 at %, 30 at %, 40 at % or 50 at %, including any range between any two of the preceding values. In alternative embodiments, the bonding layer BL1 may have a nitrogen atom content of greater than zero and less than any one of the preceding values. In yet alternative embodiments, the bonding layer BL1 may have a nitrogen atom content of more than any one of the preceding values.

Specifically, the bonding layer BL1 has a gradient nitrogen concentration. In some embodiments, the nitrogen concentration of the bonding layer BL1 of the integrated circuit structure 10 is increased away from the substrate 100 of the integrated circuit structure 10. For example, the bonding layer BL1 may include an upper portion having a nitrogen amount of 40-60 at %, a middle portion having a nitrogen amount of 30-40 at %, and a lower amount having a nitrogen amount of 10-30 at %. In some embodiments, the nitridized metal portion on the top of the bonding pad BP1 has a nitrogen atom content (e.g., average nitrogen atom content) similar to or different from that of the adjacent bonding layer BL1.

In some embodiments, the bonding layer BL1 of the integrated circuit structure 10 has a thickness of about 1-20 nm, such as about 5-15 nm. In some embodiments, the thickness of the bonding layer BL1 to the underlying silicon layer 114 ranges from 1:10 to 1:5000, such as from 1:100 to 1:1000. In some embodiments, as shown in the enlarged view A, the bonding layer BL1 of the integrated circuit structure 10 formed from the plasma treatment 119 has a rough top surface TS and a rough bottom surface BS. In some embodiments, the top surface TS and the bottom surface BS of the bonding layer BL1 are rough and uneven. The rough surface may be wavy, wrinkled and/or non-smooth from a top view. In some embodiments, the bonding layer BL1 has a (top or bottom) surface roughness Rz of about 0.5-5 nm, such as 1 nm, 2 nm, 3 nm or 4 nm, including any range between any two of the preceding values and any range more than any one of the preceding values. In some embodiments, the surface roughness Rz is calculated by measuring the vertical distance from the highest peak to the lowest valley within a predetermined sampling length or area (e.g., across the integrated circuit structure 10).

In some embodiments, the plasma treatment 119 further includes an oxygen-containing plasma other than the described nitrogen-containing plasma. In some embodiments, the oxygen-containing compound precursor includes $O_2$, $O_3$, $N_2O$, $CO_2$ or a combination thereof. In some embodiments, the oxygen amount accounts for less than about 20 vol % of the total gas amount, and the nitrogen amount accounts for more than about 50 vol % (e.g., 70-90 vol %) of the total gas amount. In some embodiments, the surface portion of the exposed silicon layer 114 is reacted with nitrogen and oxygen to form a silicon oxynitride layer as a bonding layer. In some embodiments, the bonding layer BL1 has a nitrogen atom content of about 10-60 at %, and an oxygen atom content of about 5-30 at %. In some embodiments, the surface portion of each exposed bonding feature BF1 (e.g., bonding pad BP1) may be reacted with nitrogen and oxygen to form a metal oxynitride portion 115 (as shown in the enlarged view B). In some embodiments, the metal oxynitride portion 115 is as thick as or thinner than the adjacent bonding layer BL1. The metal oxynitride portion 115 is too thin to affect the subsequently bonding performance.

In some embodiments, the plasma treatment 119 includes an oxygen-containing plasma instead of the described nitrogen-containing plasma. In some embodiments, the oxygen-containing compound precursor includes $O_2$, $O_3$, $N_2O$, $CO_2$ or a combination thereof. In some embodiments, the oxygen amount accounts for more than about 50 vol % (e.g., 70-90 vol %) of the total gas amount. In some embodiments, the surface portion of the exposed silicon layer 114 is reacted with oxygen to form a silicon oxide layer as a bonding layer. In some embodiments, the surface portion of each exposed bonding feature BF1 (e.g., bonding pad BP1) may be reacted with oxygen to form an oxidized metal portion 115 (as shown in the enlarged view B). In some embodiments, the oxidized metal portion 115 is as thick as or thinner than the adjacent bonding layer BL1. The oxidized metal portion 115 is too thin to affect the subsequently bonding performance.

Figure 1C:
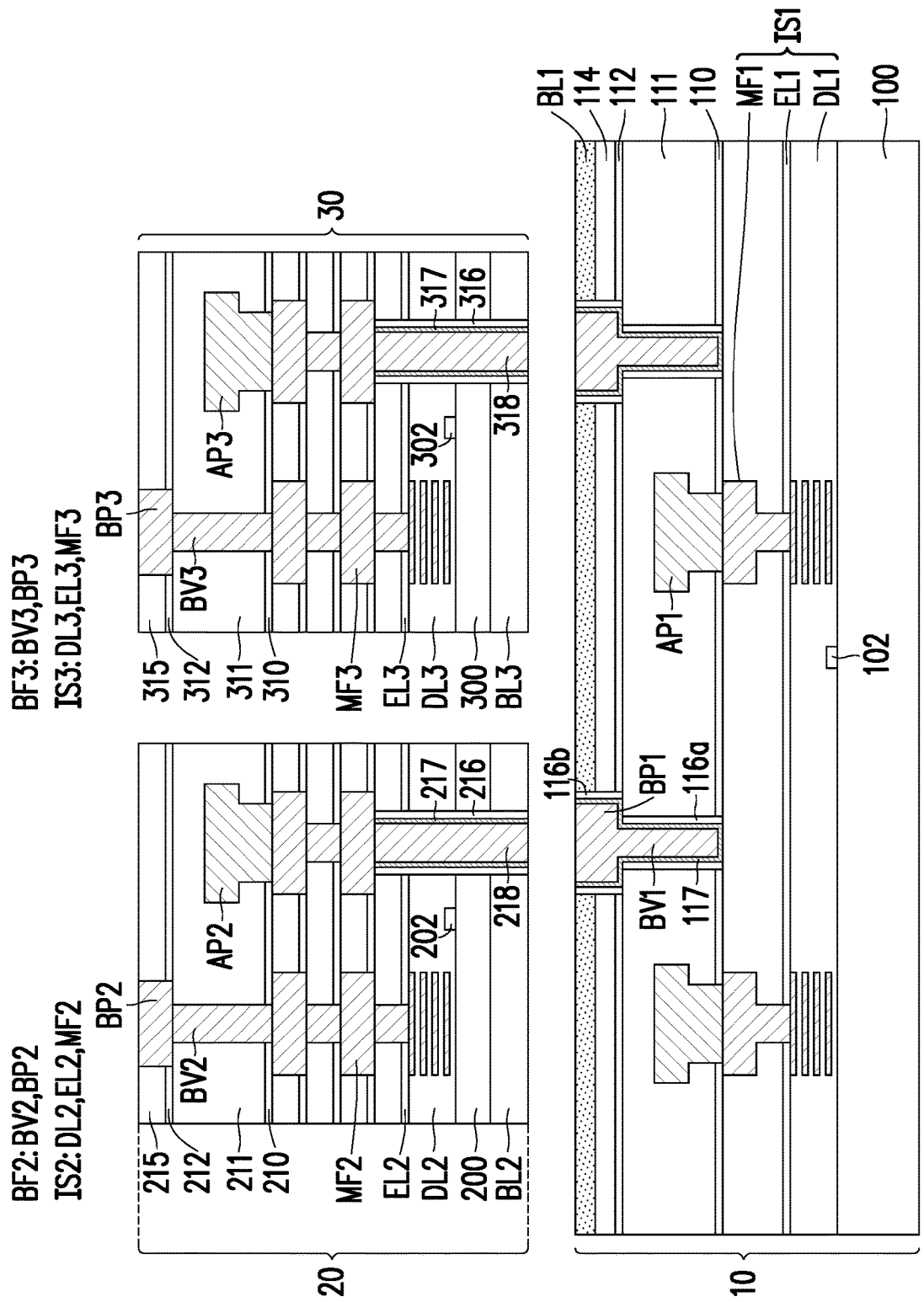

Referring to FIG. 1C, an integrated circuit structure 20 is provided. The integrated circuit structure 20 may be an application-specific integrated circuit (ASIC) chip, an analog chip, a sensor chip, a wireless and radio frequency chip, a voltage regulator chip or a memory chip, for example. In some embodiments, the integrated circuit structure 20 includes a substrate 200, an interconnect structure IS2, conductive pads AP2 and a passivation layer 211.

The substrate 200 includes an elementary semiconductor such as silicon, germanium and/or a compound semiconductor such as silicon germanium, silicon carbide, gallium arsenic, indium arsenide, gallium nitride or indium phosphide. In some embodiments, the substrate 200 includes a silicon-containing material. For example, the substrate 200 is a silicon-on-insulator (SOI) substrate or a silicon substrate. The silicon substrate includes a single-crystalline silicon substrate, an amorphous silicon substrate, a polysilicon substrate or a combination thereof. In various embodiments, the substrate 200 may take the form of a planar substrate, a substrate with multiple fins, nanowires, or other forms known to people having ordinary skill in the art. Depending on the requirements of design, the substrate 200 may be a P-type substrate or an N-type substrate and may have doped regions therein. The doped regions may be configured for an N-type device or a P-type device.

The substrate 200 includes isolation structures defining at least one active area, and at least one device 202 is disposed in the active area. The at least one device 202 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the device 202 includes a gate dielectric layer, a gate electrode, source/drain regions, spacers, and the like. In some embodiments, the integrated circuit structure 20 is referred to as a "second device die" through the specification.

The interconnect structure IS2 is disposed over a first side (e.g., front side) of the substrate 200. Specifically, the interconnect structure IS2 is disposed over and electrically connected to the device 202. In some embodiments, the interconnect structure IS2 includes dielectric layers DL2 and metal features MF2. The metal features MF2 are disposed in the dielectric layers DL2 and electrically connected with each other. Portions of the metal features MF2 are exposed by the topmost dielectric layer DL2. In some embodiments, each dielectric layer DL2 includes silicon oxide, silicon oxynitride, silicon nitride, a low dielectric constant (low-k) material having a dielectric constant less than 3.5, or a combination thereof. In some embodiments, the metal features MF2 include metal plugs and metal lines. The plugs may include contacts formed in the inter-layer dielectric layer, and vias formed in the inter-metal dielectric layer. The contacts are formed between and in contact with a bottom metal line and the underlying device 202. The vias are formed between and in contact with two metal lines. Each metal feature MF2 may include tungsten (W), copper (Cu), a copper alloy, aluminum (Al), an aluminum alloy or a combination thereof. In some embodiments, a barrier layer may be disposed between each metal feature MF2 and the dielectric layer DL2 to prevent the material of the metal feature MF2 from migrating to the underlying device 202. The barrier layer may include Ta, TaN, Ti, TiN, CoW or a combination thereof. A seed layer may be optionally formed between each metal feature and the barrier layer. The seed layer may include Cu, Ag or the like. In some embodiments, the interconnect structure IS2 further includes an etching stop layer EL2 between two adjacent metal features and/or two adjacent dielectric layers. The etching stop layer EL2 may include SiN, SiC, SiCN, AlN, $Al_2O_3$ or a combination thereof. In some embodiments, the interconnect structure IS2 is formed by a dual damascene process. In alternative embodiments, the interconnect structure IS2 is formed by multiple single damascene processes. In yet alternative embodiments, the interconnect structure IS2 is formed by an electroplating process.

The conductive pads AP2 are formed over and electrically connected to the interconnect structure IS2. The conductive pad AP2 may be aluminum-containing pads. In some embodiments, some of the conductive pads AP2 have probe marks on the surfaces thereof. In other words, the integrated circuit structure 20 is a "known good die". In alternative embodiments, the conductive pads AP2 are free of probe marks.

The passivation layer 211 is formed over the interconnect structure IS2 and covers the conductive pads AP2. In some embodiments, the passivation layer 211 includes silicon oxide, silicon nitride, benzocyclobutene (BCB) polymer, polyimide (PI), polybenzoxazole (PBO) or a combination thereof, and is formed by a suitable process such as spin coating, CVD or the like. In some embodiments, the passivation layer 211 is formed after the testing process is performed.

The passivation layer 211 may have a multi-layer structure. In some embodiments, the passivation layer 211 includes a lower passivation layer laterally aside the sidewall of the lower portion of each conductive pad AP2, and an upper passivation layer disposed on the lower passivation layer and covering the sidewall and top surface of the upper portion of the conductive pad AP2. The lower and upper passivation layers may be formed of the same material or different materials. In some embodiments, an etching stop layer 210 is formed between the conductive pad AP2 and the underlying topmost metal feature MF2. The etching stop layer 210 may include SiN, SiC, SiCN, AlN, $Al_2O_3$ or a combination thereof.

In some embodiments, the integrated circuit structure 20 further includes at least one through substrate via 218 that penetrates through the substrate 200. In some embodiments, the through substrate via 218 penetrates the substrate 200 and is landed on one of the metal features MF2 of the interconnect structure IS2. Specifically, the through substrate via 218 is electrically connected to the interconnect structure IS2 and the bonding feature of another integrated circuit structure (e.g., the bonding feature BF1 of the integrated circuit structure 10). In some embodiments, the through substrate via 218 is called a "backside bonding feature" of the integrated circuit structure 20. In other embodiments, the through substrate via 218 penetrates the substrate 200 and the interconnect structure IS2, and optionally penetrates through the passivation layer 211 and the bonding layer 215 as needed. In some embodiments, the through substrate via 218 includes copper, a copper alloy, aluminum, an aluminum alloy or a combination thereof. In some embodiments, a barrier layer 217 is formed between each through substrate via 218 and the adjacent film layer (e.g., the substrate 200 and/or the dielectric layer DL2). The barrier layer 217 may include Ta, TaN, Ti, TiN, CoW or a combination thereof. A seed layer may be optionally formed between each through substrate via 218 and the barrier layer 217. The seed layer may include Cu, Ag or the like. In some embodiments, the through substrate via 218 is formed by a damascene process. In some embodiments, the through substrate via 218 is formed by an electroplating process. In some embodiments, an insulating liner 216 is formed between the through substrate vias 218 and the substrate 200. The insulating liner 216 may include silicon oxide or the like.

In some embodiments, a bonding layer BL2 is further included in the integrated circuit structure 20 and configured to surround a portion of the through substrate via 218 exposed by the substrate 200. The bonding layer BL2 includes silicon oxide or the like. In some embodiments, the through substrate via 218 is formed by a "TSV last process", and the barrier layer and/or the seed layer may be formed on the surface contacting the landed metal feature MF2. In other embodiments, the through substrate via 218 is formed by a "TSV first process", and the barrier layer and/or the seed layer may be formed on the surface contacting the integrated circuit structure 10.

In some embodiments, the integrated circuit structure 20 further includes front-side bonding features BF2. In some embodiments, each bonding feature BF2 includes a bonding pad, a bonding via, a through substrate via or a combination thereof. When the through substrate via penetrates through the whole integrated circuit structure 20, such through substrate via may serve as both front-side and backside bonding feature. In some embodiments, as shown in FIG. 1C, each bonding feature BF2 includes a bonding via BV2 embedded in the passivation layer 211 and an overlying bonding pad BP2 embedded in an insulating layer 215 over the passivation layer 211. Each bonding feature BF2 may include tungsten (W), copper (Cu), a copper alloy, aluminum (Al), an aluminum alloy or a combination thereof. In some embodiments, a barrier layer and/or a seed layer may be optionally formed between each bonding feature and the adjacent film. The insulating layer 215 may include silicon oxide or a passivation material and may function as a front-side bonding layer in some examples. In some embodiments, an etching stop layer 212 is formed between two adjacent bonding features BF2 and/or two adjacent film layers. The etching stop layer 212 may include SiN, SiC, SiCN, AlN, Al$_2$O$_3$ or a combination thereof. In some embodiments, the bonding features BF2 are formed by a dual damascene process. In alternative embodiments, the bonding features BF2 are formed by multiple single damascene processes. In yet alternative embodiments, the bonding features BF2 are formed by an electroplating process.

One difference between the integrated circuit structure 20 and the integrated circuit structure 10 lies in the die size. The size of the integrated circuit structure 20 is different from (e.g., less than) the size of the integrated circuit structure 10. Herein, the term "size" is referred to the length, width and/or area. For example, as shown in the top view of FIG. 1C, the size or area of the integrated circuit structure 20 is less than the size or area of the integrated circuit structure 10.

Still referring to FIG. 1C, an integrated circuit structure 30 is provided. In some embodiments, the integrated circuit structure 30 has a structure or function similar to that of the integrated circuit structure 20. In some embodiments, the integrated circuit structure 30 includes a substrate 300 and an interconnect structure IS3. The substrate 300 has a device 302 formed thereon and a through substrate via 318 penetrating therethrough. A barrier layer 317 and an insulting liner 318 are disposed between the through substrate via 318 and the adjacent film layer. An insulating liner 316 is formed between the through substrate vias 318 and the substrate 300. The interconnect structure IS3 includes dielectric layers DL3, metal features MF3 disposed in the dielectric layers DL3, and etching stop layers EL3 disposed between adjacent metal features and/or adjacent dielectric layers. The integrated circuit structure 30 further includes conductive pads AP3 and a passivation layer 311 covering the conductive pads AP3.

In some embodiments, a bonding layer BL3 is further included in the integrated circuit structure 30 and configured to surround a portion of the through substrate via 318 exposed by the substrate 300. The through substrate via 318 may be formed by a "TSV last process" or a "TSV first process" upon the process requirements. In some embodiments, the bonding layer BL3 serves as a backside bonding layer, and the through substrate via 318 serves as a backside bonding feature.

The integrated circuit structure 30 further includes front-side bonding features BF3. In some embodiments, each bonding feature BF3 includes a bonding pad, a bonding via, a through substrate via or a combination thereof. In some embodiments, as shown in FIG. 1C, each bonding feature BF3 includes a bonding via BV3 embedded in the passivation layer 311 and an overlying bonding pad BP3 embedded in an insulating layer 315 over the passivation layer 311. The mentioned elements of the integrated circuit structure 30 are similar to those described in the integrated circuit structure 20, so the materials and forming methods are not iterated herein.

In other embodiments, at least one of the integrated circuit structures 20 and 30 is free of a device and serves as a dummy die. In some embodiments, the dummy die indicates a non-operating die, a die configured for non-use, a die without devices therein or a die used only to electrically couple together two other dies in the die stack. In some embodiments, the dummy die functions as an electrical connector between adjacent dies. In some embodiments, the dummy die can be utilized to stiffen the package and protect the package against deformation. In some embodiments, the dummy die can be configured to reduce coefficient of thermal expansion (CTE) mismatch and improve the warpage profile of the resulting package.

Figure 1D:
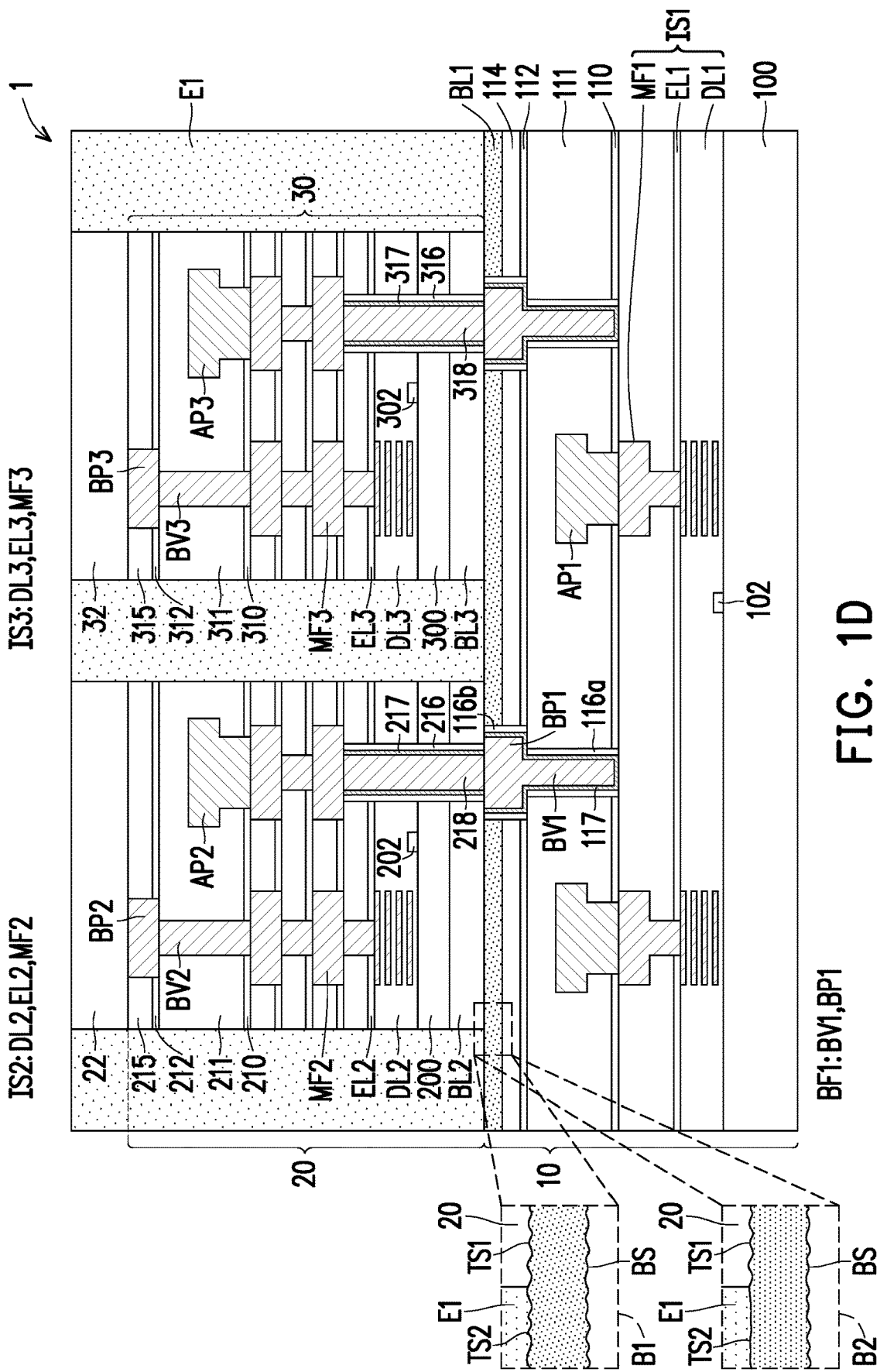

Referring to FIG. 1D, each of the integrated circuit structure 20 and the integrated circuit structure 30 is placed on and bonded to the integrated circuit structure 10 through a bonding process.

In some embodiments, the integrated circuit structure 20 and the integrated circuit structure 10 are back-to-face bonded together by a hybrid bonding including a metal-to-metal bonding and a dielectric-to-dielectric bonding. Specifically, the bonding layer BL2 of the integrated circuit structure 20 is bonded to the bonding layer BL1 of the integrated circuit structure 10, and the second bonding feature (e.g., through substrate via 218) of the integrated circuit structure 20 is bonded to the first bonding feature (e.g., bonding pad BP1) of the integrated circuit structure 10. In some embodiments, before the integrated circuit structure 20 is bonded to and electrically connected to the integrated circuit structure 10, the second bonding feature and the first bonding feature are aligned by using an optical sensing method. In some embodiments, the width of the second bonding feature of the integrated circuit structure 20 is different from (e.g., smaller than) the width of the first bonding feature of the integrated circuit structure 10. However, the disclosure is not limited thereto. In other embodiments, the width of the second bonding feature of the integrated circuit structure 20 is substantially the same as the width of the first bonding feature of the integrated circuit structure 10.

In some embodiments, the integrated circuit structure 30 and the integrated circuit structure 10 are back-to-face bonded together by a hybrid bonding including a metal-to-metal bonding and a dielectric-to-dielectric bonding. Specifically, the bonding layer BL3 of the integrated circuit structure 30 is bonded to the bonding layer BL1 of the integrated circuit structure 10, and the third bonding feature (e.g., through substrate via 318) of the integrated circuit structure 30 is bonded to the first bonding feature (e.g., bonding pad BP1) of the integrated circuit structure 10. In some embodiments, before the integrated circuit structure 30 is bonded to and electrically connected to the integrated circuit structure 10, the third bonding feature and the first bonding feature are aligned by using an optical sensing method. In some embodiments, the width of the third bonding feature of the integrated circuit structure 30 is different from (e.g., smaller than) the width of the first bonding feature of the integrated circuit structure 10. However, the disclosure is not limited thereto. In other embodiments, the width of the third bonding feature of the integrated circuit structure 30 is substantially the same as the width of the first bonding feature of the integrated circuit structure 10.

Thereafter, a thermal treatment such as an annealing process at an elevated temperature is performed to strengthen the bonding strength between the integrated circuit structure 10 and each of the integrated circuit structures 20 and 30.

Still referring to FIG. 1D, support structures 22 and 32 are mounted on the integrated circuit structure 20 and the integrated circuit structure 30, respectively. Specifically, the support structure 22 is bonded to the top of the integrated circuit structure 20, and a bonding layer (not shown) is optionally formed between the support structure 22 and the integrated circuit structure 20. Similarly, the support structure 32 is bonded to the top of the integrated circuit structure 30, and a bonding layer (not shown) is optionally formed between the support structure 32 and the integrated circuit structure 30. In some embodiments, each of the support structures 22 and 32 includes silicon. The support structures 22 and 32 are referred to as "silicon supports" in some examples. In some embodiments, the support structures 22 and 32 are used to protect the underlying the integrated circuit structures 20 and 30, and improve the mechanical performance and/or the thermal dissipation performance of the resulted semiconductor package. In some embodiments, each of the support structures 22 and 32 has a sufficient size (e.g. width, thickness) to provide the enough support for the underlying structure. The dimension (e.g., width) of the support structure is substantially the same as or greater than the dimension (e.g., width) of the underlying structure. In some embodiments, each of the support structures 22 and 32 is free of a device and serves as a dummy die. In some embodiments, each of the support structures 22 and 32 functions as an electrical connector between adjacent dies. However, the disclosure is not limited thereto. In some embodiments, each of the support structures 22 and 32 has a device therein as needed.

Thereafter, a dielectric encapsulation E1 is formed over the integrated circuit structure 10 and around or aside the integrated circuit structure 20 and the integrated circuit structure 30. Specifically, the dielectric encapsulation E1 surrounds the sidewalls of the integrated circuit structures 20 and 30, exposes the tops of the integrated circuit structures 20 and 30, and overlays the first side (e.g., front side) of the integrated circuit structure 10. In some embodiments, the second sides (e.g., back sides) of the integrated circuit structures 20 and 30 are substantially coplanar with the top surface of the dielectric encapsulation E1. In some embodiments, the dielectric encapsulation E1 includes a molding compound, a molding underfill, a resin or the like. In some embodiments, the dielectric encapsulation E1 includes a polymer material such as polybenzoxazole (PBO), polyimide, benzocyclobutene (BCB), a combination thereof, or the like, and is formed by a molding process followed by a grinding process until the surfaces of the support structures 22 and 32 are exposed. In alternative embodiments, the dielectric encapsulation E1 includes silicon oxide, silicon nitride or a combination thereof, and is formed by spin-coating, lamination, deposition or the like, and followed by a grinding process or a planarization process. After the dielectric encapsulation E1 is formed, a semiconductor package 1 of the disclosure is thus completed.

In the disclosure, upon the bonding process and the molding process, the top surface TS and the bottom surface BS of the bonding layer BL1 are rough and uneven, and the bonding layer BL1 has a (top or bottom) surface roughness Rz of about 0.5-5 nm. In some embodiments, as shown in the enlarged view B1, the top surface TS1 of the bonding layer BL1 covered by the integrated circuit structures 20 and 30 is as rough as the top surface TS2 of the bonding layer BL1 exposed by the integrated circuit structures 20 and 30 and covered by the dielectric encapsulation E1. In other embodiments, as shown in the enlarged view B2, the top surface TS1 of the bonding layer BL1 covered by the integrated circuit structures 20 and 30 is rougher than the top surface TS2 of the bonding layer BL1 exposed by the integrated circuit structures 20 and 30 and covered by the dielectric encapsulation E1. In other embodiments, the top surface TS of the bonding layer BL1 may be substantially planar while the bottom surface BS of the bonding layer BL1 is still rough and uneven upon the bonding process and the molding process.

In the disclosure, as compared to the conventional bonding layer formed by a deposition process at an elevated temperature, the bonding layer (e.g., bonding layer BL1) of the disclosure formed by a plasma treatment at a lower temperature (e.g., room temperature) is beneficial to prevent the underlying devices (e.g., temperature-sensitive devices such as memory chips) from being damaged by the high-temperature process. Therefore, the device performance of the semiconductor package of the disclosure is significantly improved due to less thermal budget and simple process steps.

Figure 2:
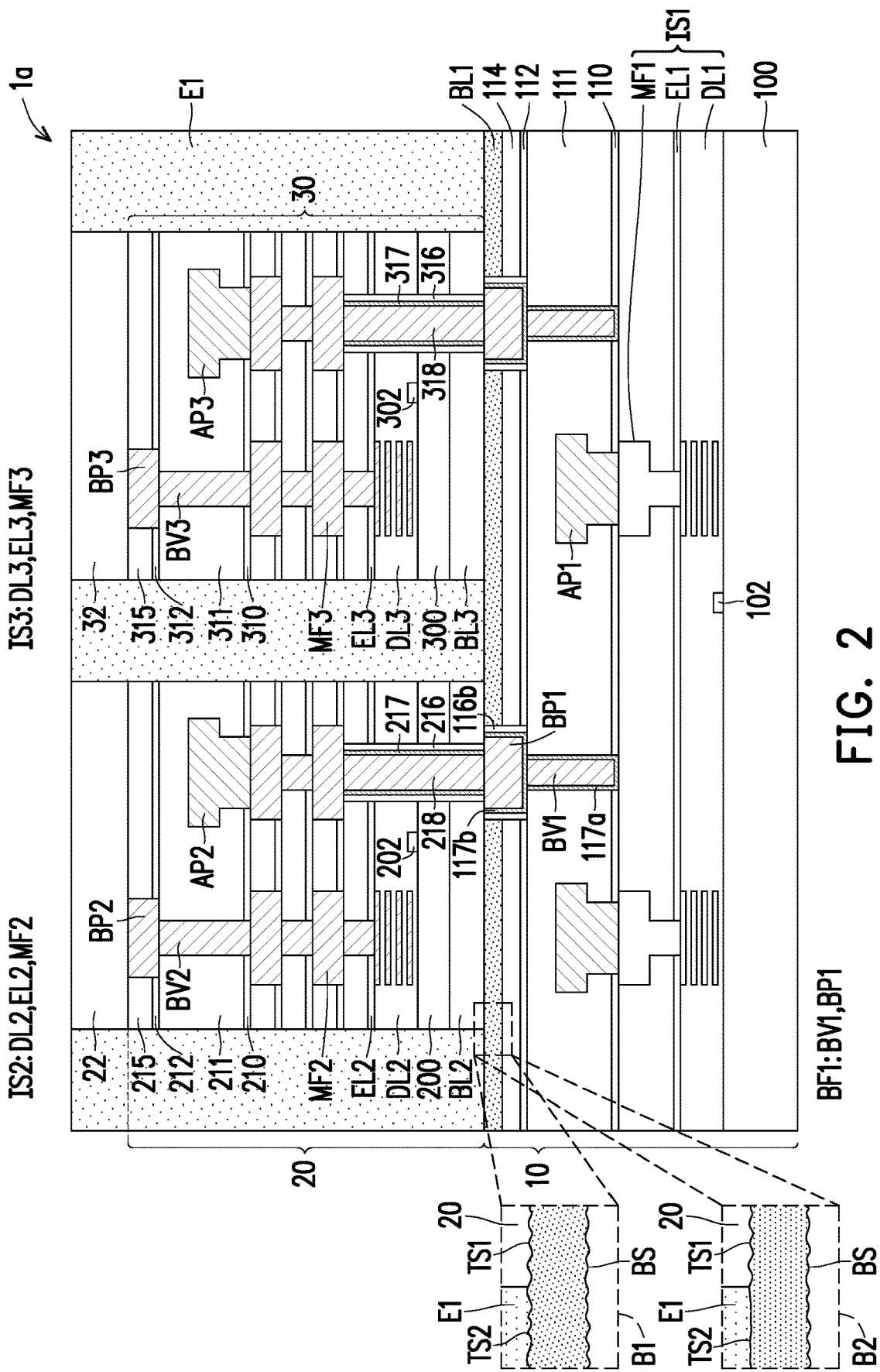
FIG. 2 is a cross-sectional view of a semiconductor package in accordance with some embodiments.

FIG. 2 is a cross-sectional view of a semiconductor package in accordance with some embodiments. The semiconductor package 1a of FIG. 2 is similar to the semiconductor package 1 of FIG. 1D, except that the bonding features BF1 of the integrated circuit structures 10 of FIG. 2 and FIG. 1D are formed by different processes. The difference between them is described below, and the similarity is not iterated herein. Specifically, the bonding pad BP1 and the underlying bonding via BV1 in FIG. 1D are formed by a dual damascene process, so the barrier layer 117 (and/or seed layer) is formed conformally along the T-shaped opening, and no interface is present between the bonding pad BP1 and the underlying bonding via BV1. However, the bonding pad BP1 and the underlying bonding via BV1 in FIG. 2 are formed by two single damascene processes or two electroplating processes, so the barrier layer 117a (and/or seed layer) is formed along the sidewall and bottom of the bonding via BV1, and the barrier layer 117b (and/or seed layer) is formed along the sidewall and bottom of the bonding pad BP1. In certain embodiments, the insulating liner 117b is required to form between the bonding pad BP1 and the silicon layer 114, but the insulating liner 117a between the bonding via BV1 and the passivation layer 111 may be omitted as needed.

Some structures of the disclosure are illustrated below with reference to the cross-sectional views of FIG. 1D and FIG. 2. In some embodiments, a semiconductor package 1/1a includes an integrated circuit structure 10 and an integrated circuit structure 20/30. The integrated circuit structure 10 includes a substrate 100, a passivation layer 111 over the substrate 100, a silicon layer 114 over the passivation layer 111, a bonding layer BL1 over the silicon layer 114, and a first bonding feature (e.g., bonding pad BP1) embedded in the bonding layer BL1 and the silicon layer 114. In some embodiments, the integrated circuit structure 10 further includes conductive pads AP1 between the silicon layer 114 and the substrate 100, and the passivation layer 111 covers the conductive pads AN. The integrated circuit structure 20/30 includes a second substrate 200/300, a bonding layer BL2/BL3 over the substrate 200/300, and a second bonding feature (e.g., through substrate via 218/318) embedded in the bonding layer BL2/BL3. The integrated circuit structure 10 is bonded to the integrated circuit structure 20/30 through the bonding layer BL1 and the bonding layer BL2/BL3 and through the first bonding feature (e.g., bonding pad BP1) and the second bonding feature (e.g., through substrate via 218/318).

In some embodiments, the bonding layer BL1 has a gradient nitrogen concentration. In some embodiments, the nitrogen concentration of the bonding layer BL1 of the integrated circuit structure 10 is increased towards the bonding layer BL2/BL3 of the integrated circuit structure 20/30.

In some embodiments, the width of the first bonding feature (e.g., bonding pad BP1) is different from (e.g. greater than) the width of the second bonding feature (e.g., through substrate via 218/318). In other embodiments, the width of the first bonding feature may be the same as or less than the width of the second bonding feature upon the process requirements. In some embodiments, a nitridized metal portion is further included between the first bonding feature and the second bonding feature.

In some embodiments, the bonding layer BL1 has a first surface (e.g., top surface TS) bonding to the bonding layer BL2/BL3 and a second surface (e.g., bottom surface BS) opposite to the first surface, and the second surface is rough and uneven. In some embodiments, the second surface (e.g., bottom surface BS) is as rougher as the first surface (e.g., top surface TS1/2 of the enlarged view B1). In some embodiments, the second surface (e.g., bottom surface BS) is rougher than at least a portion of the first surface (e.g., top surface TS2 of the enlarged view B2).

In some embodiments, an insulating liner 116b is disposed between the first bonding feature (e.g., bonding pad BP1) and each of the bonding layer BL1 and the silicon layer 114. In some embodiments, an insulating layer 116a is optionally disposed between the bonding via BV1 (underlying the bonding pad BP1) and the passivation layer 111.

FIG. 3A to FIG. 3D are cross-sectional views of a method of forming a semiconductor package in accordance with alternative embodiments. It is understood that the disclosure is not limited by the method described below. Additional operations can be provided before, during, and/or after the method and some of the operations described below can be replaced or eliminated, for additional embodiments of the methods.

Figure 3A:
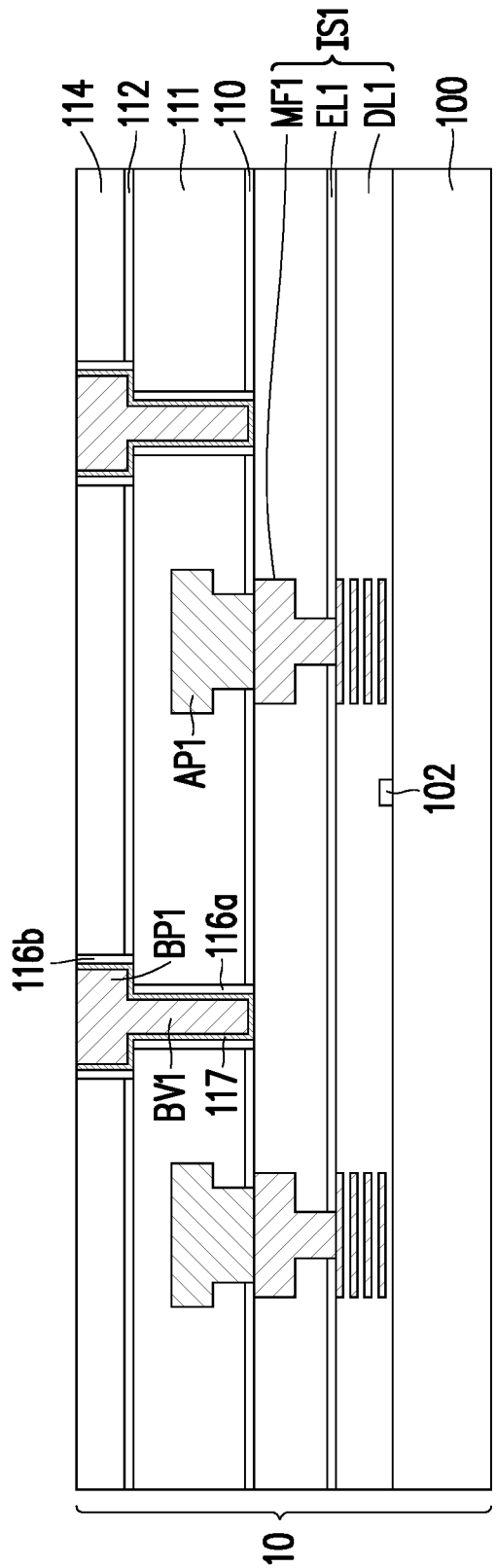

Referring to FIG. 3A, an integrated circuit structure 10 is provided. The elements and configurations of the integrated circuit structure 10 may refer to those described in FIG. 1A, so details are not iterated herein.

Figure 3B:
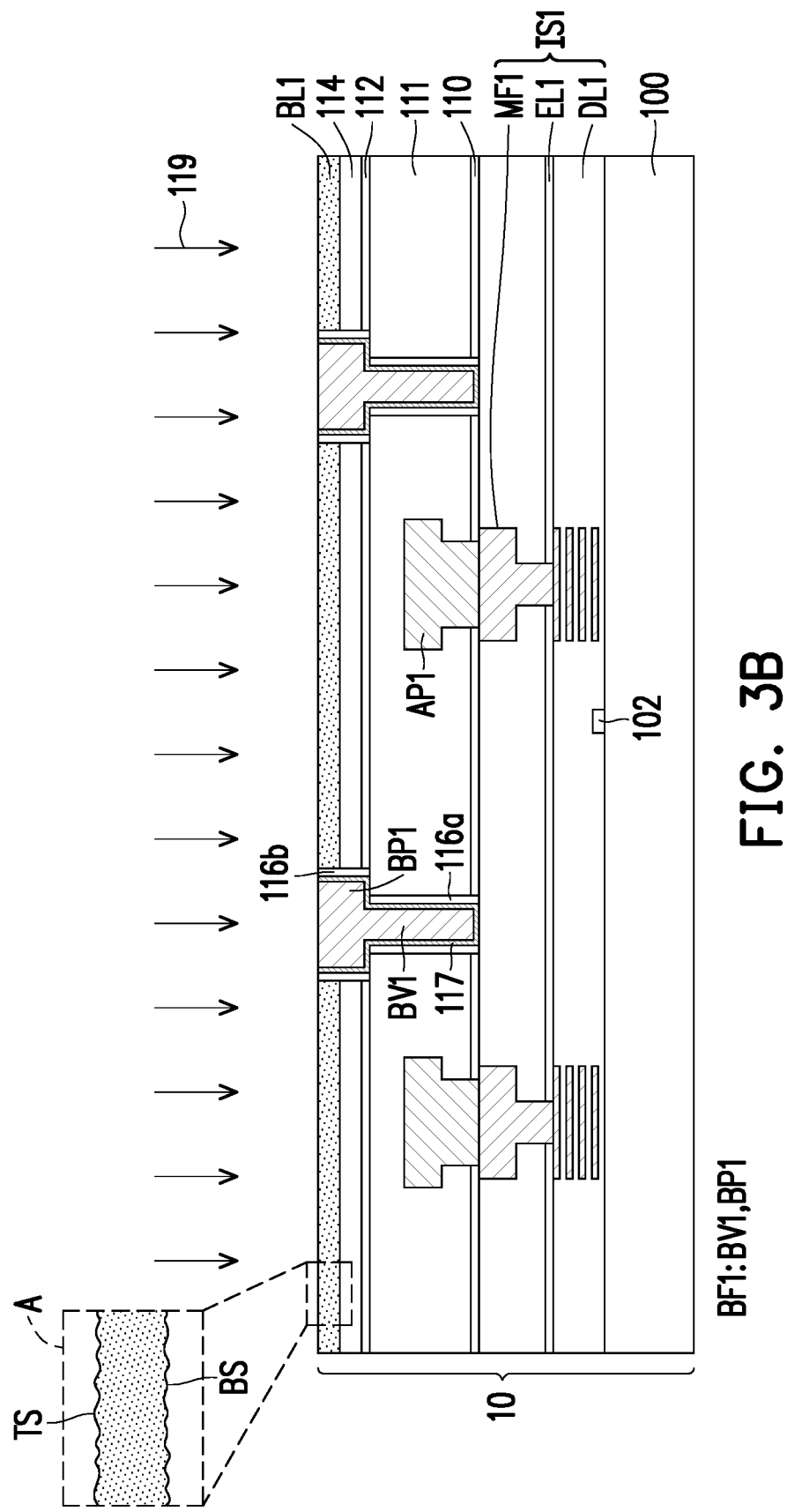

Referring to FIG. 3B, a plasma treatment 119 is performed to transform a top portion of the silicon layer 114 to a bonding layer BL1 on the remaining silicon layer 114 of the integrated circuit structure 10. The plasma parameters of the plasma treatment 119 may refer to those described in FIG. 1B, so details are not iterated herein.

Referring to FIG. 3C, an integrated circuit structure 40 is provided. In some embodiments, the integrated circuit structure 40 includes a logic die 400, a plurality of memory dies 420 stacked on the first side 400a (e.g., front side) of the logic die 400, and a dielectric encapsulation 424 disposed on the logic die 400 and aside the memory dies 420.

In some embodiments, the logic die 400 is provided on a first carrier (not shown). In some embodiments, the logic die 400 has a device on and/or in the substrate, an interconnect structure over the substrate, a conductive pad over the interconnect structure, a passivation layer over the conductive pad. In some embodiments, the elements and configurations of the integrated circuit structure 40 may refer to those described for the integrated circuit structure 20, and the details are not iterated herein. In some embodiments, the logic die 400 further includes at least one through substrate via 418. In some embodiments, a barrier layer 417 is formed between each through substrate via 418 and the adjacent film layer (e.g., the substrate and/or the dielectric layer). A seed layer may be optionally formed between each through substrate via 318 and the barrier layer 417. In some embodiments, an insulating liner 416 is formed between the through substrate via 418 and the substrate. In some embodiments, the through substrate via 418 may be formed by a "TSV first" process. In some embodiments, the logic die 400 has one or more connector 402 on the first side 400a (e.g., front side) thereof. The connectors 402 may include copper, solder, gold or the like. The connectors 402 may be in a form of pillars and/or micro bumps.

Thereafter, multiple memory dies 420 are stacked on the first side 400a of the logic die 400. In some embodiments, each of the memory die 420 includes a substrate, at least one through substrate via 422, and connectors 404 on the front side and the back side thereof. The connector 402 of the logic die 400 is bonded to the connector 404 of the lowermost memory die 420 through a bump 406, and an underfill layer 408 is formed to fill the space between the logic die 400 and the lowermost memory die 420. Similarly, the adjacent memory dies 420 are bonded to each other through the connectors 404 and a bump 406, and an underfill layer 408 is formed to fill the space between the adjacent memory dies 420.

In some embodiments, a dielectric encapsulation layer 424 is formed on the logic die 400 and surrounds the memory dies 420. In some embodiments, the surface of the dielectric encapsulation layer 424 is coplanar with the surface of the topmost memory die 420. In some embodiments, the dielectric encapsulation 424 includes a molding compound, a molding underfill, a resin or the like. In some embodiments, the dielectric encapsulation 424 includes a polymer material such as polybenzoxazole (PBO), polyimide, benzocyclobutene (BCB), a combination thereof, or the like, and is formed by a molding process followed by a grinding process until the surface of the topmost memory die 420 of the integrated circuit structure 40 is exposed. In alternative embodiments, the dielectric encapsulation 424 includes silicon oxide, silicon nitride or a combination thereof, and is formed by spin-coating, lamination, deposition or the like, and followed by a grinding process or a planarization process. The operation of forming the dielectric encapsulation layer 424 is optional and may be omitted in some examples.

Next, a second carrier (not shown) is bonded to the topmost memory die 420, and the first carrier is removed. The substrate of the logic die 400 is thinned to expose a portion of the through substrate via 418, and a bonding layer BL4 is formed to surround the exposed portion of the through substrate via 418. In some embodiments, the second carrier is removed after the integrated circuit structure 40 is bonded to the integrated circuit structure 10. In other embodiments, the second carrier remains in the final structure and serves as a support or cover for protecting the underlying integrated circuit structure.

Still referring to FIG. 3C, an integrated circuit structure 50 is provided. In some embodiments, the integrated circuit structure 50 has a structure or function similar to that of the integrated circuit structure 40. In some embodiments, the integrated circuit structure 50 includes a logic die 500 and a plurality of memory dies 520 stacked on the first side 500a (e.g., front side) of the logic die 500.

In some embodiments, the logic die 500 includes a substrate, at least one through substrate via 518, at least one connector 502 on the first side 400a, and a bonding layer BL5 disposed on the second side 500b and surrounding a portion of the through substrate via 518 exposed by the substrate. In some embodiments, each of the memory dies 520 includes a substrate, at least one through substrate via 522, and connectors 504 on the front side and the back side thereof. Besides, the adjacent dies are bonded to each other through a bump 506 and an underfill layer 508 is formed to fill the space between the adjacent dies.

In some embodiments, the integrated circuit structure 50 further includes a dielectric encapsulation 524 disposed on the logic die 500 and aside the memory dies 520. The dielectric encapsulation layer 524 is optional and may be omitted in some examples.

Figure 3D:
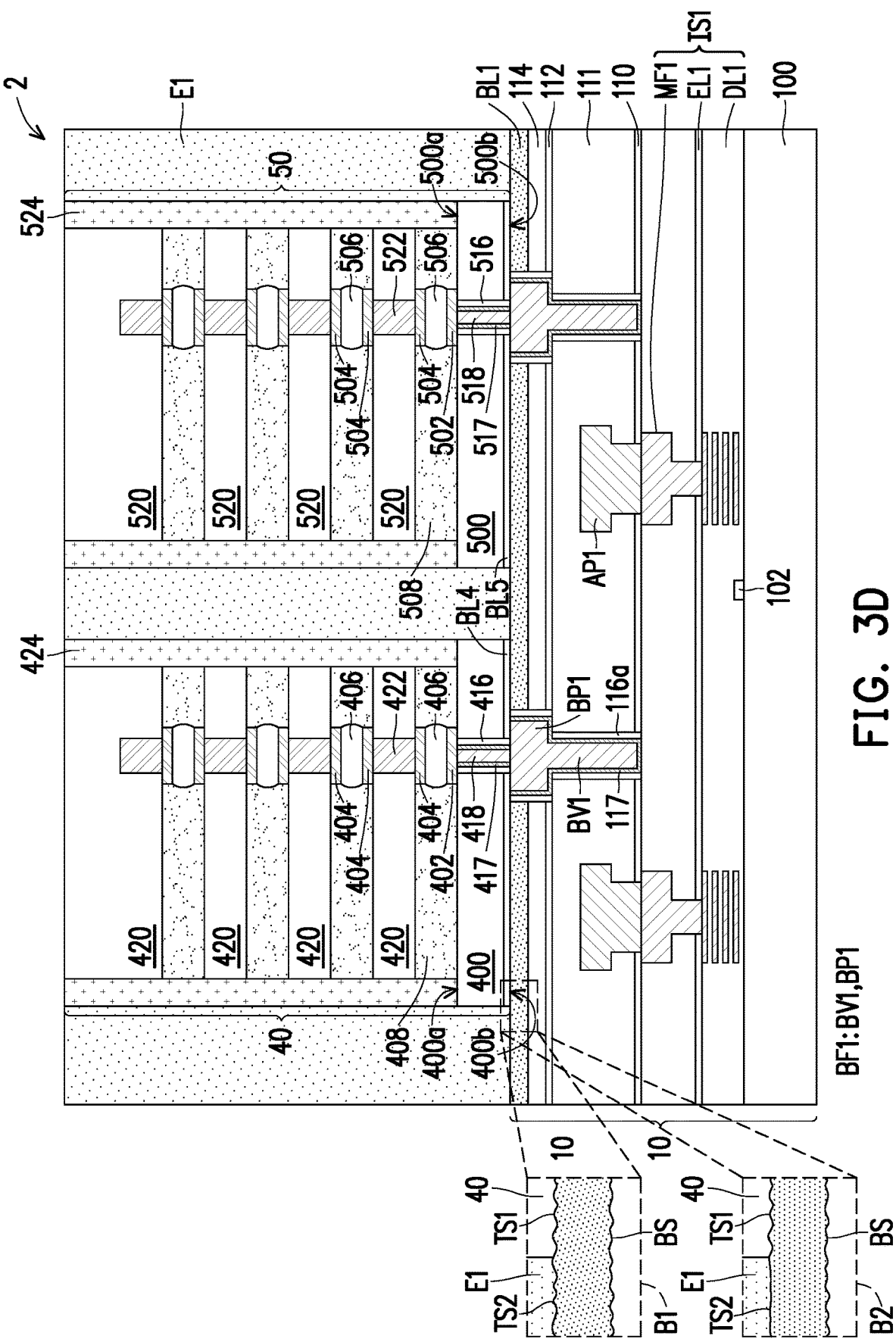

Referring to FIG. 3D, each of the integrated circuit structure 40 and the integrated circuit structure 50 is placed on and bonded to the integrated circuit structure 10 through a bonding process.

In some embodiments, the integrated circuit structure 40 and the integrated circuit structure 10 are back-to-face bonded together by a hybrid bonding including a metal-to-metal bonding and a dielectric-to-dielectric bonding. Specifically, the bonding layer BL4 of the integrated circuit structure 40 is bonded to the bonding layer BL1 of the integrated circuit structure 10, and the fourth bonding feature (e.g., through substrate via 418) of the integrated circuit structure 40 is bonded to the first bonding feature (e.g., bonding pad BP1) of the integrated circuit structure 10. In some embodiments, before the integrated circuit structure 40 is bonded to and electrically connected to the integrated circuit structure 10, the fourth bonding feature and the first bonding feature are aligned by using an optical sensing method. In some embodiments, the width of the fourth bonding feature of the integrated circuit structure 40 is different from (e.g., smaller than) or the same as the width of the first bonding feature of the integrated circuit structure 10.

In some embodiments, the integrated circuit structure 50 and the integrated circuit structure 10 are back-to-face bonded together by a hybrid bonding including a metal-to-metal bonding and a dielectric-to-dielectric bonding. Specifically, the bonding layer BL5 of the integrated circuit structure 50 is bonded to the bonding layer BL1 of the integrated circuit structure 10, and the fifth bonding feature (e.g., through substrate via 518) of the integrated circuit structure 50 is bonded to the first bonding feature (e.g., bonding pad BP1) of the integrated circuit structure 10. In some embodiments, before the integrated circuit structure 50 is bonded to and electrically connected to the integrated circuit structure 10, the fifth bonding feature and the first bonding feature are aligned by using an optical sensing method. In some embodiments, the width of the fifth bonding feature of the integrated circuit structure 50 is different from (e.g., smaller than) or the same as the width of the first bonding feature of the integrated circuit structure 10.

Thereafter, a thermal treatment such as an annealing process at an elevated temperature is performed to strengthen the bonding strength between the integrated circuit structure 10 and each of the integrated circuit structures 40 and 50.

Still referring to FIG. 3D, a dielectric encapsulation E1 is formed over the integrated circuit structure 10 and around or aside the integrated circuit structure 40 and the integrated circuit structure 50. Specifically, the dielectric encapsulation E1 surrounds the sidewalls of the integrated circuit structures 40 and 50, exposes the tops of the integrated circuit structures 40 and 50, and overlays the first side (e.g., front side) of the integrated circuit structure 10. In some embodiments, the second sides (e.g., back sides) of the integrated circuit structures 40 and 50 are substantially coplanar with the top surface of the dielectric encapsulation E1. In some embodiments, the dielectric encapsulation E1 includes a molding compound, a molding underfill, a resin or the like. In some embodiments, the dielectric encapsulation E1 includes a polymer material such as polybenzoxazole (PBO), polyimide, benzocyclobutene (BCB), a combination thereof, or the like, and is formed by a molding process followed by a grinding process until the surfaces of the integrated circuit structures 40 and 50 are exposed. In alternative embodiments, the dielectric encapsulation E1 includes silicon oxide, silicon nitride or a combination thereof, and is formed by spin-coating, lamination, deposition or the like, and followed by a grinding process or a planarization process. After the dielectric encapsulation E1 is formed, a semiconductor package 2 of the disclosure is thus completed.

In some embodiments, the dielectric encapsulation E1, the dielectric encapsulation 424 and the dielectric encapsulation 524 are made by the same material. Specifically, an interface is not present between the dielectric encapsulation E1 and each of the dielectric encapsulation 424 and the dielectric encapsulation 524. In other embodiments, the dielectric encapsulation E1, the dielectric encapsulation 424 and the dielectric encapsulation 524 are made by different materials. Specifically, an interface is present between the dielectric encapsulation E1 and each of the dielectric encapsulation 424 and the dielectric encapsulation 524.

In some embodiments, the dielectric encapsulation 424 and the dielectric encapsulation 524 are formed prior to the formation of the dielectric encapsulation E1. However, the disclosure is not limited thereto. In other embodiments, the operations of forming the dielectric encapsulation 424 and the dielectric encapsulation 524 may be omitted, and the dielectric encapsulation E1 is formed to encapsulate the integrated circuit structures 40 and 50 and in physical contact with the logic dies 400 and 500 and the memory dies 420 and 520.

In the disclosure, upon the bonding process and the molding process, the top surface TS and the bottom surface BS of the bonding layer BL1 are rough and uneven, and the bonding layer BL1 has a (top or bottom) surface roughness Rz of about 0.5-5 nm. In some embodiments, as shown in the enlarged view B1, the top surface TS1 of the bonding layer BL1 covered by the integrated circuit structures 40 and 50 is as rough as the top surface TS2 of the bonding layer BL1 exposed by the integrated circuit structures 40 and 50 and covered by the dielectric encapsulation E1. In other embodiments, as shown in the enlarged view B2, the top surface TS1 of the bonding layer BL1 covered by the integrated circuit structures 40 and 50 is rougher than the top surface TS2 of the bonding layer BL1 exposed by the integrated circuit structures 40 and 50 and covered by the dielectric encapsulation E1. In other embodiments, the top surface TS of the bonding layer BL1 may be substantially planar while the bottom surface BS of the bonding layer BL1 is still rough and uneven upon the bonding process and the molding process.

Figure 4:
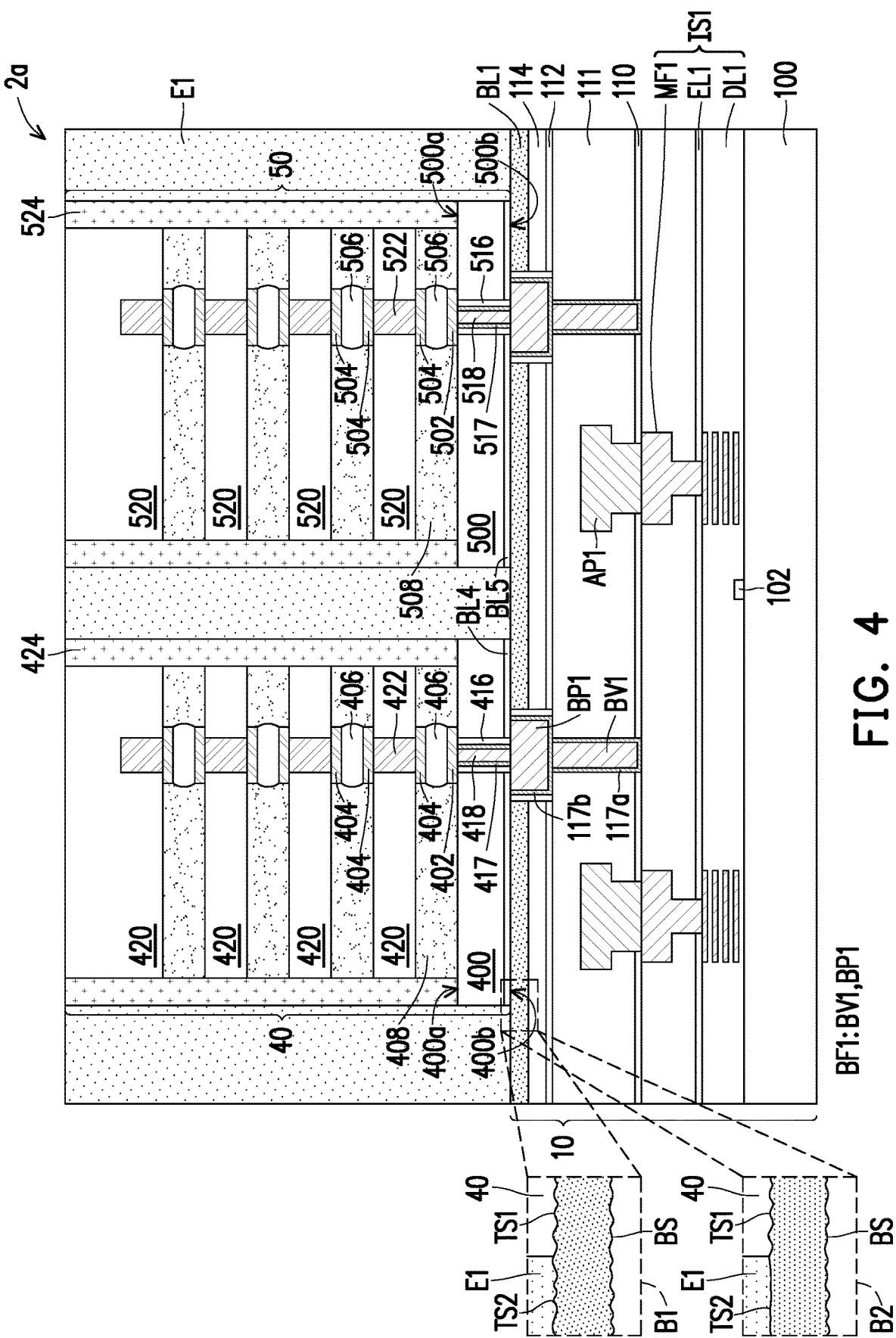
FIG. 4 is a cross-sectional view of a semiconductor package in accordance with alternative embodiments.

FIG. 4 is a cross-sectional view of a semiconductor package in accordance with alternative embodiments. The semiconductor package 2a of FIG. 4 is similar to the semiconductor package 2 of FIG. 3D, except that the bonding features BF1 of the integrated circuit structures 10 of FIG. 4 and FIG. 3D are formed by different processes. The difference between them is described below, and the similarity is not iterated herein. Specifically, the bonding pad BP1 and the underlying bonding via BV1 in FIG. 3D are formed by a dual damascene process, so the barrier layer 117 (and/or seed layer) is formed conformally along the T-shaped opening, and no interface is present between the bonding pad BP1 and the underlying bonding via BV1. However, the bonding pad BP1 and the underlying bonding via BV1 in FIG. 4 are formed by two single damascene processes or two electroplating processes, so the barrier layer 117a (and/or seed layer) is formed along the sidewall and bottom of the bonding via BV1, and the barrier layer 117b (and/or seed layer) is formed along the sidewall and bottom of the bonding pad BP1. In certain embodiments, the insulating liner 117b is required to form between the bonding pad BP1 and the silicon layer 114, but the insulating liner 117a between the bonding via BV1 and the passivation layer 111 may be omitted as needed.

Some structures of the disclosure are illustrated below with reference to the cross-sectional views of FIG. 3D and FIG. 4. In some embodiments, a semiconductor package 2/2a includes an integrated circuit structure 10 and an integrated circuit structure 40/50. The integrated circuit structure 10 includes a first substrate 100, a passivation layer 111 over the first substrate 100, a silicon layer 114 over the passivation layer 111, a bonding layer BL1 over the silicon layer 114, and a first bonding feature (e.g., bonding pad BP1) embedded in the bonding layer BL1 and the silicon layer 114. The integrated circuit structure 40/50 includes a logic die 400/500 and a plurality of memory dies 420/620 stacked on the front side of the logic die 400/500. The logic die 400/500 includes a second substrate, a second bonding feature (e.g., through substrate via 418/518) embedded in the bonding layer BL4/BL5. The integrated circuit structure 10 is bonded to the integrated circuit structure 40/50 through the bonding layer BL1 and the bonding layer BL4/BL5 and through the first bonding feature (e.g., bonding pad BP1) and the second bonding feature (e.g., through substrate via 418/518).

FIG. 5A to FIG. 5D are cross-sectional views of a method of forming a semiconductor package in accordance with yet alternative embodiments. It is understood that the disclosure is not limited by the method described below. Additional operations can be provided before, during, and/or after the method and some of the operations described below can be replaced or eliminated, for additional embodiments of the methods.

Figure 5A:
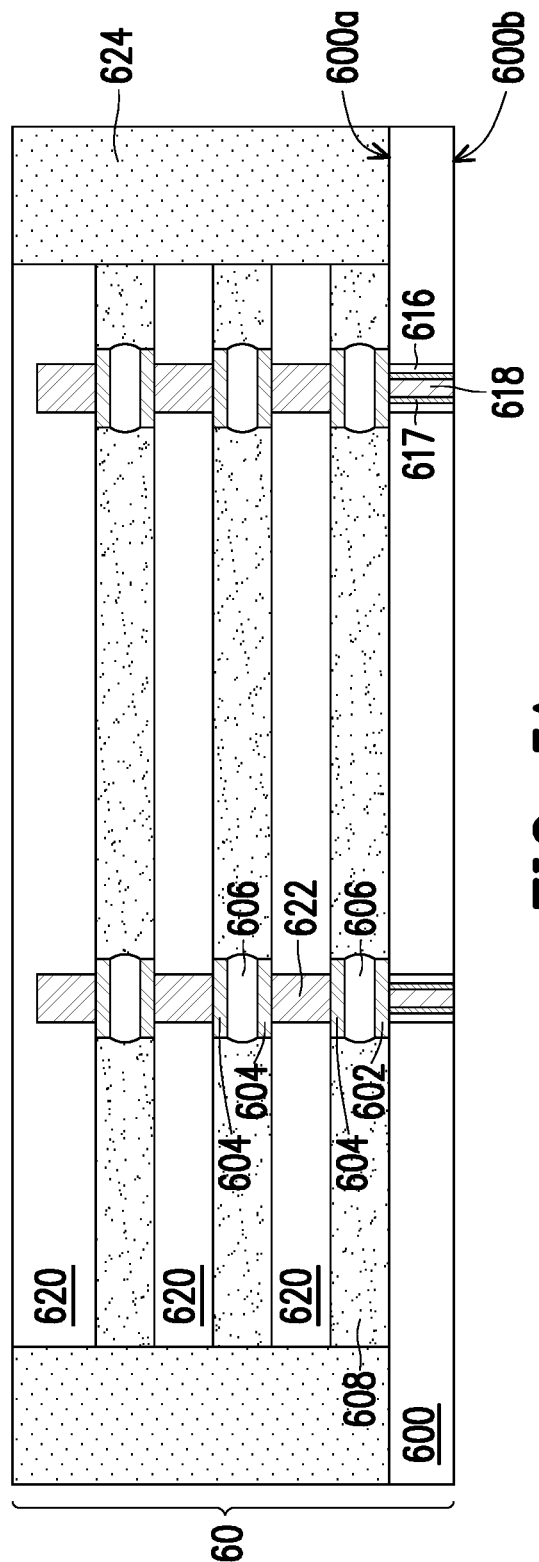
FIG. 5A to FIG. 5D are cross-sectional views of a method of forming a semiconductor package in accordance with yet alternative embodiments.

Referring to FIG. 5A, an integrated circuit structure 60 is provided. In some embodiments, the integrated circuit structure 60 includes a logic die 600, a plurality of memory dies 620 stacked on the first side 600a (e.g., front side) of the logic die 600, and a dielectric encapsulation 624 disposed on the logic die 600 and aside the memory dies 620.

In some embodiments, the logic die 600 is provided on a first carrier (not shown). In some embodiments, the logic die 600 includes a substrate, such as a silicon-containing substrate. For example, the substrate of the logic die 600 is a silicon-on-insulator (SOI) substrate or a silicon substrate. In some embodiments, the substrate of the logic die 600 includes substantially pure silicon. For example, the substrate of the logic die 600 has a silicon content of about 90 at %, 95 at % or more. The silicon substrate includes a single-crystalline silicon substrate, an amorphous silicon substrate, a polysilicon substrate or a combination thereof. In some embodiments, the substrate of the logic die 600 is a nitrogen free layer. In some embodiments, the substrate of the logic die 600 is an oxygen free layer. In various embodiments, the substrate 100 may take the form of a planar substrate, a substrate with multiple fins, nanowires, or other forms known to people having ordinary skill in the art. Depending on the requirements of design, the substrate of the logic die 600 may be a P-type substrate or an N-type substrate and may have doped regions therein. The doped regions may be configured for an N-type device or a P-type device.

In some embodiments, the logic die 600 has a device on and/or in the substrate, an interconnect structure over the substrate, a conductive pad over the interconnect structure, and a passivation layer over the conductive pad. In some embodiments, the elements and configurations of the integrated circuit structure 60 may refer to those described for the integrated circuit structure 20, and the details are not iterated herein.

In some embodiments, the integrated circuit structure 60 further includes through substrate vias 618 that penetrate through the substrate of the logic die 600. In some embodiments, the through substrate vias 618 penetrate the substrate and are landed on some of the metal features of the interconnect structure. Specifically, the through substrate vias 618 are configured to electrically connect to the interconnect structure of the integrated circuit structure 60 and the bonding features of other integrated circuit structures. In some embodiments, the through substrate vias 618 are called "backside bonding features" of the integrated circuit structure 60. In some embodiments, each through substrate via 618 includes copper, a copper alloy, aluminum, an aluminum alloy or a combination thereof. In some embodiments, a barrier layer 617 is formed between each through substrate via 618 and the adjacent film layer (e.g., the substrate and/or the dielectric layer). A seed layer may be optionally formed between each through substrate via 618 and the barrier layer 617. In some embodiments, an insulating liner 616 is formed between the through substrate via 618 and the substrate. In some embodiments, the through substrate via 618 may be formed by a "TSV first" process. In some embodiments, the logic die 600 has connectors 602 on the first side 600a thereof. The connectors 602 may include copper, solder, gold or the like. The connectors 602 may be in a form of pillars and/or micro bumps.

Thereafter, multiple memory dies 620 are stacked on the first side 600a of the logic die 600. In some embodiments, each of the memory die 620 includes a substrate, through substrate vias 622, and connectors 604 on the front side and the back side thereof. The connectors 602 of the logic die 600 are bonded to the connectors 604 of the lowermost memory die 620 through bumps 606, and an underfill layer 608 is formed to fill the space between the logic die 600 and the lowermost memory die 620. Similarly, the adjacent memory dies 620 are bonded to each other through the connectors 604 and bumps 606, and an underfill layer 608 is formed to fill the space between the adjacent memory dies 620.

In some embodiments, a dielectric encapsulation layer 624 is formed on the logic die 600 and surrounds the memory dies 620. In some embodiments, the surface of the dielectric encapsulation layer 624 is coplanar with the surface of the topmost memory die 620. In some embodiments, the dielectric encapsulation 624 includes a molding compound, a molding underfill, a resin or the like. In some embodiments, the dielectric encapsulation 624 includes a polymer material such as polybenzoxazole (PBO), polyimide, benzocyclobutene (BCB), a combination thereof, or the like, and is formed by a molding process followed by a grinding process until the surface of the topmost memory die 620 of the integrated circuit structure 60 is exposed. In alternative embodiments, the dielectric encapsulation 624 includes silicon oxide, silicon nitride or a combination thereof, and is formed by spin-coating, lamination, deposition or the like, and followed by a grinding process or a planarization process. The operation of forming the dielectric encapsulation layer 624 is optional and may be omitted in some examples.

Next, a second carrier (not shown) is bonded to the topmost memory die 620, and the first carrier is removed. The substrate of the logic die 600 is thinned to expose surfaces of the through substrate vias 618. In some embodiments, the second carrier is removed after the integrated circuit structure 40 is bonded to the integrated circuit structure 10. In other embodiments, the second carrier remains in the final structure and serves as a support or cover for protecting the underlying integrated circuit structure.

Figure 5B:
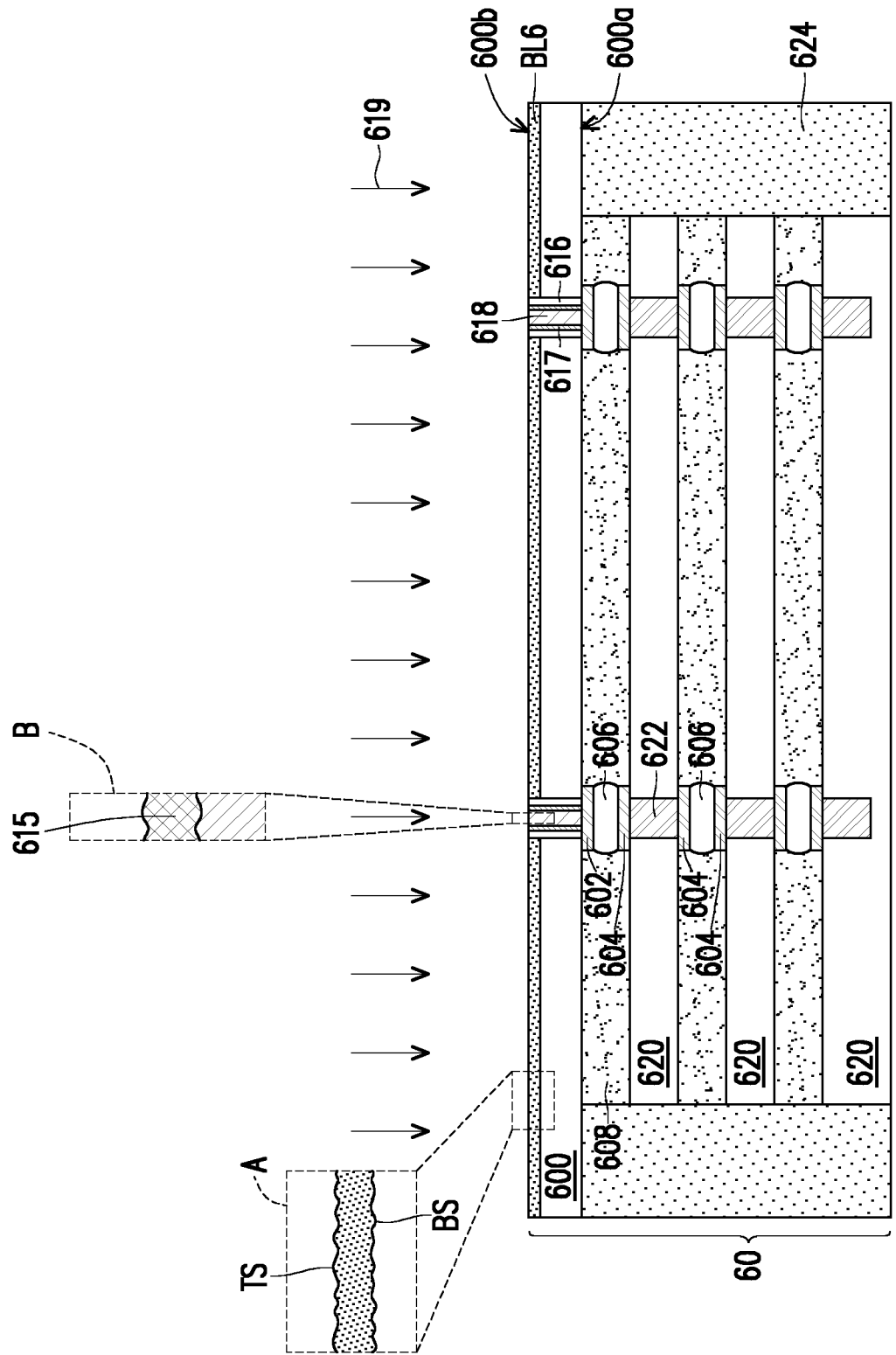

Referring to FIG. 5B, the integrated circuit structure 60 is turned over, and a plasma treatment 619 is performed to the substrate of the logic die 600 at the back side 600b thereof, so as to form a bonding layer BL6 in a surface portion of the substrate of the logic die 600 of the integrated circuit structure 60.

In some embodiments, the plasma treatment 619 is a nitrogen-containing plasma. The operation in FIG. 5B may be referred to as a nitridation process, a nitrogen treatment, a plasma nitridization procedure or a nitrogen plasma implantation in some examples. Specifically, the plasma treatment 619 is performed to the substrate of the logic die 600, and thus, the bonding layer BL6 is formed in the backside surface portion of the substrate of the logic die 600. In some embodiments, the bonding layer BL6 is in physical contact with the insulating layer 616 aside the through substrate vias 618.

In some embodiments, the plasma treatment 619 includes $N_2$, $NH_3$, $NH_4$, $NH_x$ (wherein x is between 0 and 1), the like or a combination thereof. In some embodiments, the plasma treatment 619 is a pure nitrogen gas. In alternative embodiments, the nitrogen-containing ambient may be diluted with an inert gas such as, for example, argon (Ar), helium (He), neon (Ne), or a mixture thereof. In some embodiments, the amount of the nitrogen-containing gas is greater than the amount of the inert gas, so as to effectively form the bonding layer BL6. In some embodiments, the nitrogen amount accounts for more than about 50 vol % of the total gas amount. In some embodiments, the plasma treatment 619 includes a dilute gas (e.g., argon) and a nitrogen-containing gas (e.g., nitrogen), and the volume ratio of the dilute gas to the nitrogen-containing gas ranges from about 1:1 to about 1:10, such as 1:2, 1:3, 1:4, 1:5, 1:6, 1:7, 1:8, 1:9 or 1:10, including any range between any two of the preceding values. The volume ratio of the dilute gas to the nitrogen-containing gas may be less than any one of the preceding values.

In some embodiments, the backside surface portion of the substrate of the logic die 600 is reacted with nitrogen to form a silicon nitride layer as a bonding layer. In some embodiments, the surface portion of each exposed through substrate via 618 may be reacted with nitrogen to form a nitridized metal portion 615 (as shown in the enlarged view B). In some embodiments, the nitridized metal portion 615 is as thick as or thinner than the adjacent bonding layer BL6. The nitridized metal portion 615 is too thin to affect the subsequently bonding performance.

Besides, the plasma reactor control parameters (such as chamber temperature, process time, power, chamber pressure, gas flow rate and the like) may be selected before processing the plasma treatment 619. In some embodiments, the plasma treatment 619 includes a chamber temperature of −20 to 100° C. (e.g., 15-70° C. or 20-30° C.), a process time to 10 to 3,600 seconds (e.g., 60-600 seconds), a power of 200 to 2,000 W (e.g., 300-700 W), a nitrogen flow rate of 20 to 2,000 sccm (e.g., 200-800 sccm), and a chamber pressure of 1 to 100 Pa (e.g., 5-50 pa).

In some embodiments, the bonding layer BL6 has a nitrogen atom content of about 10-60 at %, such as 20 at %, 30 at %, 40 at % or 50 at %, including any range between any two of the preceding values. In alternative embodiments, the bonding layer BL6 may have a nitrogen atom content of greater than zero and less than any one of the preceding values. In yet alternative embodiments, the bonding layer BL6 may have a nitrogen atom content of more than any one of the preceding values.

Specifically, the bonding layer BL6 has a gradient nitrogen concentration. In some embodiments, the nitrogen concentration of the bonding layer BL6 of the integrated circuit structure 60 is increased away from the memory dies 620 of the integrated circuit structure 60. For example, the bonding layer BL6 may include an upper portion having a nitrogen amount of 40-60 at %, a middle portion having a nitrogen amount of 30-40 at %, and a lower amount having a nitrogen amount of 10-30 at %. In some embodiments, the nitridized metal portion on the top of the through substrate via 618 has a nitrogen atom content (e.g., average nitrogen atom content) similar to or different from that of the adjacent bonding layer BL6.

In some embodiments, the bonding layer BL6 of the integrated circuit structure 60 has a thickness of about 1-20 nm, such as about 5-15 nm. In some embodiments, the thickness of the bonding layer BL6 to the remaining substrate of the logic die 600 ranges from 1:10 to 1:5000, such as from 1:100 to 1:1000. In some embodiments, as shown in the enlarged view A, the bonding layer BL6 of the integrated circuit structure 60 formed from the plasma treatment 619 has a rough top surface TS and a rough bottom surface BS. In some embodiments, the top surface TS and the bottom surface BS of the bonding layer BL6 are rough and uneven. The rough surface may be wavy, wrinkled and/or non-smooth from a top view. In some embodiments, the bonding layer BL6 has a (top or bottom) surface roughness Rz of about 0.5-5 nm, such as 1 nm, 2 nm, 3 nm or 4 nm, including any range between any two of the preceding values and any range more than any one of the preceding values. In some embodiments, the surface roughness Rz is calculated by measuring the vertical distance from the highest peak to the lowest valley within a predetermined sampling length or area (e.g., across the integrated circuit structure 60).

In some embodiments, the plasma treatment 619 further includes an oxygen-containing plasma other than the described nitrogen-containing plasma. In some embodiments, the oxygen-containing compound precursor includes O₂, O₃, N₂O, CO₂ or a combination thereof. In some embodiments, the oxygen amount accounts for less than about 20 vol % of the total gas amount, and the nitrogen amount accounts for more than about 50 vol % of the total gas amount. In some embodiments, the surface portion of the exposed substrate of the logic die 600 is reacted with nitrogen and oxygen to form a silicon oxynitride layer as a bonding layer. In some embodiments, the bonding layer BL6 has a nitrogen atom content of about 10-60 at %, and an oxygen atom content of about 5-30 at %. In some embodiments, the surface portion of each exposed through substrate via 618 may be reacted with nitrogen and oxygen to form a metal oxynitride portion 615 (as shown in the enlarged view B). In some embodiments, the metal oxynitride portion 615 is as thick as or thinner than the adjacent bonding layer BL6. The metal oxynitride portion 615 is too thin to affect the subsequently bonding performance.

In some embodiments, the plasma treatment 619 includes an oxygen-containing plasma instead of the described nitrogen-containing plasma. In some embodiments, the oxygen-containing compound precursor includes O₂, O₃, N₂O, CO₂ or a combination thereof. In some embodiments, the oxygen amount accounts for more than about 50 vol % of the total gas amount. In some embodiments, the surface portion of the exposed substrate of the logic die 600 is reacted with oxygen to form a silicon oxide layer as a bonding layer. In some embodiments, the surface portion of each exposed through substrate via 618 may be reacted with oxygen to form an oxidized metal portion 615 (as shown in the enlarged view B). In some embodiments, the oxidized metal portion 615 is as thick as or thinner than the adjacent bonding layer BL6. The oxidized metal portion 615 is too thin to affect the subsequently bonding performance.

Figure 5C:
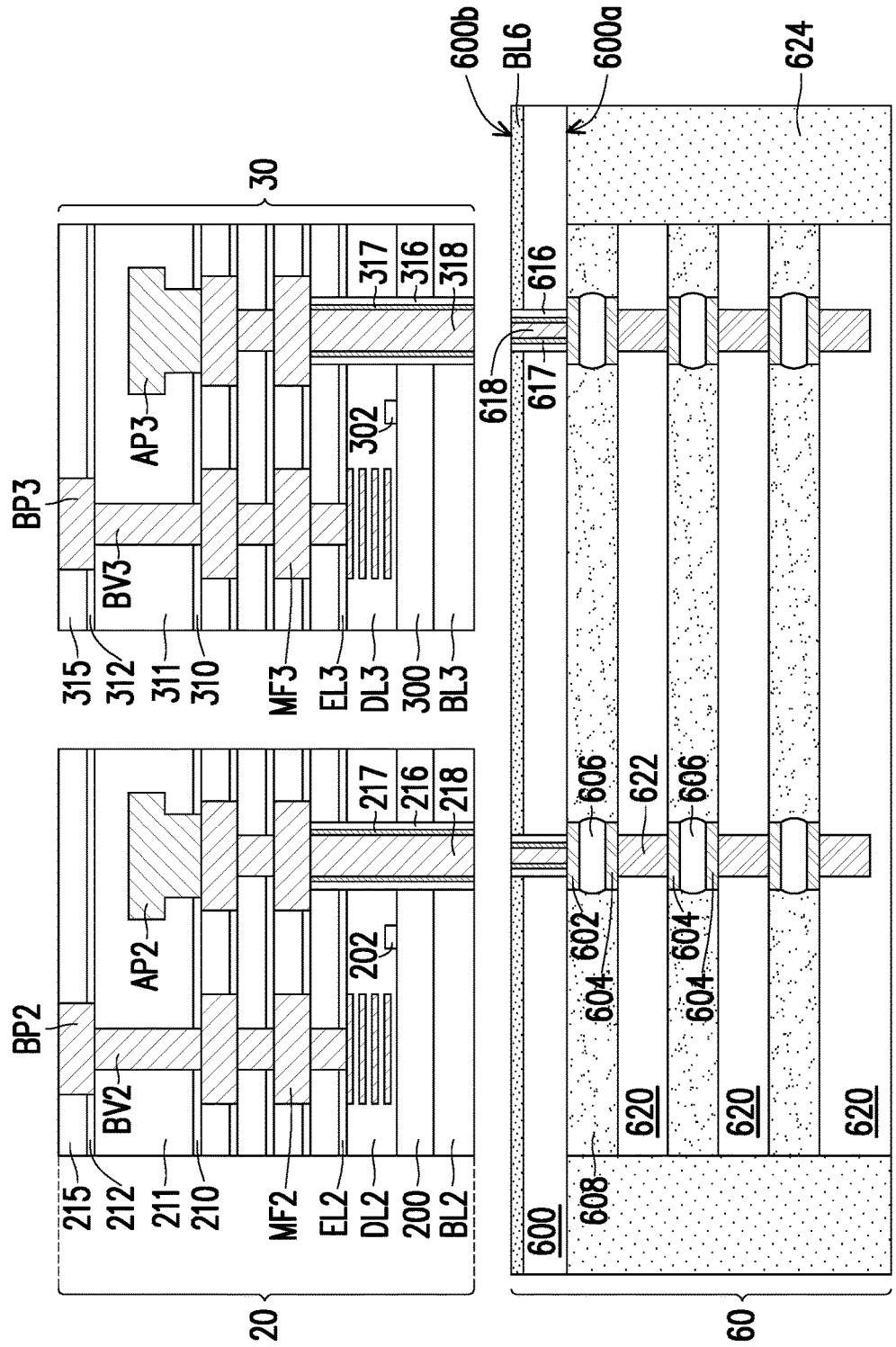

Referring to FIG. 5C, an integrated circuit structure 20 and an integrated circuit structure 30 are provided. The elements and configurations of the integrated circuit structures 20 and 30 may refer to those described in FIG. 1C, so details are not iterated herein. In some embodiments, the integrated circuit structure 20 includes a substrate 200 and a bonding layer BL2 over the substrate 200, and the integrated circuit structure 30 includes a substrate 300 and a bonding layer BL3 over the substrate 300.

Figure 5D:
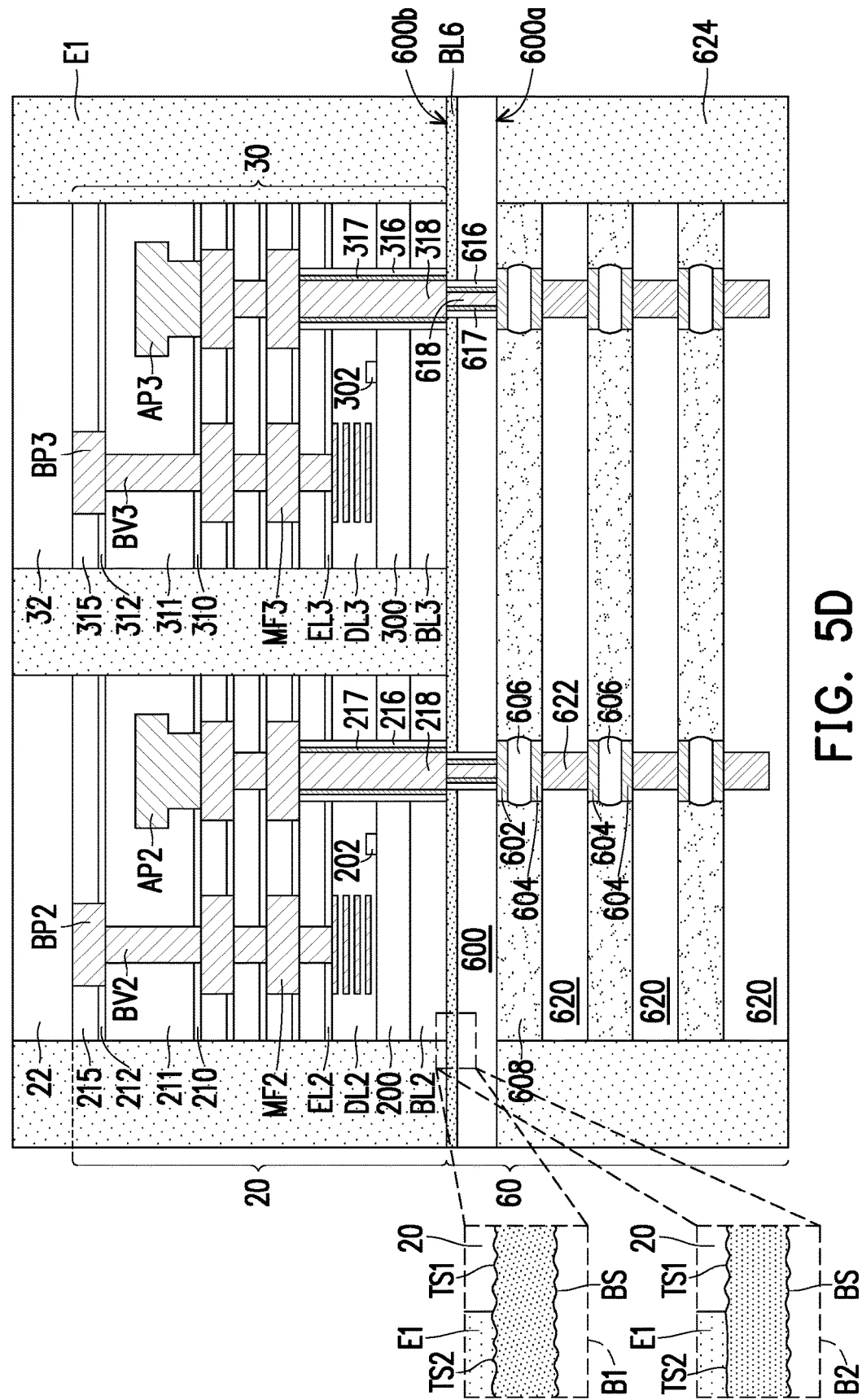

Referring to FIG. 5D, each of the integrated circuit structure 20 and the integrated circuit structure 30 is placed on and bonded to the integrated circuit structure 60 through a bonding process.

In some embodiments, the integrated circuit structure 20 and the integrated circuit structure 60 are back-to-back bonded together by a hybrid bonding including a metal-to-metal bonding and a dielectric-to-dielectric bonding. Specifically, the bonding layer BL2 of the integrated circuit structure 20 is bonded to the bonding layer BL6 of the integrated circuit structure 60, and the second bonding feature (e.g., through substrate via 218) of the integrated circuit structure 20 is bonded to the sixth bonding feature (e.g., through substrate via 618) of the integrated circuit structure 60. In some embodiments, before the integrated circuit structure 20 is bonded to and electrically connected to the integrated circuit structure 60, the second bonding feature and the sixth bonding feature are aligned by using an optical sensing method. In some embodiments, the width of the second bonding feature of the integrated circuit structure 20 is different from (e.g., smaller than) the width of the first bonding feature of the integrated circuit structure 60. However, the disclosure is not limited thereto. In other embodiments, the width of the second bonding feature of the integrated circuit structure 20 is substantially the same as the width of the first bonding feature of the integrated circuit structure 60.

In some embodiments, the integrated circuit structure 30 and the integrated circuit structure 60 are back-to-back bonded together by a hybrid bonding including a metal-to-metal bonding and a dielectric-to-dielectric bonding. Specifically, the bonding layer BL3 of the integrated circuit structure 30 is bonded to the bonding layer BL6 of the integrated circuit structure 60, and the third bonding feature (e.g., through substrate via 318) of the integrated circuit structure 30 is bonded to the sixth bonding feature (e.g., through substrate via 618) of the integrated circuit structure 60. In some embodiments, before the integrated circuit structure 30 is bonded to and electrically connected to the integrated circuit structure 60, the third bonding feature and the first bonding feature are aligned by using an optical sensing method. In some embodiments, the width of the third bonding feature of the integrated circuit structure 30 is different from (e.g., smaller than) the width of the sixth bonding feature of the integrated circuit structure 60. However, the disclosure is not limited thereto. In other embodiments, the width of the third bonding feature of the integrated circuit structure 30 is substantially the same as the width of the sixth bonding feature of the integrated circuit structure 60.

Thereafter, a thermal treatment such as an annealing process at an elevated temperature is performed to strengthen the bonding strength between the integrated circuit structure 60 and each of the integrated circuit structures 20 and 30.

Still referring to FIG. 5D, support structures 22 and 32 are mounted on the integrated circuit structure 20 and the integrated circuit structure 30, respectively. Thereafter, a dielectric encapsulation E1 is formed over the integrated circuit structure 60 and around or aside the integrated circuit structure 20 and the integrated circuit structure 30. After the dielectric encapsulation E1 is formed, a semiconductor package 3 of the disclosure is thus completed In the disclosure, upon the bonding process and the molding process, the top surface TS and the bottom surface BS of the bonding layer BL6 are rough and uneven, and the bonding layer BL6 has a (top or bottom) surface roughness Rz of about 0.5-5 nm. In some embodiments, as shown in the enlarged view B1, the top surface TS1 of the bonding layer BL6 covered by the integrated circuit structure 20 or 30 is as rough as the top surface TS2 of the bonding layer BL6 exposed by the integrated circuit structures 20 and 30 and covered by the dielectric encapsulation E1. In other embodiments, as shown in the enlarged view B2, the top surface TS1 of the bonding layer BL6 covered by the integrated circuit structure 20 or 30 is rougher than the top surface TS2 of the bonding layer BL6 exposed by the integrated circuit structures 20 and 30 and covered by the dielectric encapsulation E1. In other embodiments, the top surface TS of the bonding layer BL6 may be substantially planar while the bottom surface BS of the bonding layer BL6 is still rough and uneven upon the bonding process and the molding process.

In the disclosure, as compared to the conventional bonding layer formed by a deposition process at an elevated temperature, the bonding layer (e.g., bonding layer BL6) of the disclosure formed by a plasma treatment at a lower temperature (e.g., room temperature) is beneficial to prevent the underlying devices (e.g., temperature-sensitive devices such as memory chips) from being damaged by the high-temperature process. Therefore, the device performance of the semiconductor package of the disclosure is significantly improved due to less thermal budget and simple process steps.

Some structures of the disclosure are illustrated below with reference to the cross-sectional views of FIG. 5D. In some embodiments, a semiconductor package 3 includes an integrated circuit structure 60 and an integrated circuit structure 20/30. The integrated circuit structure 60 includes a logic die 600 and a plurality of memory dies 620 stacked on the front side of the logic die 600. In some embodiments, a width of the logic die 600 is greater than a width of the memory dies 620. The logic die 600 includes a first substrate, a through substrate via 618, and a bonding layer BL6 disposed on a back side 600b of the first substrate and having a gradient nitrogen concentration. The integrated circuit structure 20/30 includes a second/third substrate, a through substrate via 218/318, and a bonding layer BL2/BL3 disposed on a back side of the second/third substrate. The integrated circuit structure 60 is bonded to the integrated circuit structure 20/30 through the bonding layer BL6 and the bonding layer BL2/BL3 and through the through substrate via 618 and the through substrate via 218/318.

In some embodiments, the nitrogen concentration of the bonding layer BL6 of the integrated circuit structure 60 is increased towards the bonding layer BL2/BL3 of the integrated circuit structure 20/30.

In some embodiments, the bonding layer BL6 has a first surface (e.g., top surface TS) bonding to the bonding layer BL2/BL3 and a second surface (e.g., bottom surface BS) opposite to the first surface, and the second surface is rough and uneven. In some embodiments, the second surface (e.g., bottom surface BS) is as rougher as the first surface (e.g., top surface TS1/2 of the enlarged view B1). In some embodiments, the second surface (e.g., bottom surface BS) is rougher than at least a portion of the first surface (e.g., top surface TS2 of the enlarged view B2).

Many variations of the above examples are contemplated by the present disclosure. It is understood that different embodiments may have different advantages, and that no particular advantage is necessarily required of all embodiments.

In accordance with some embodiments of the present disclosure, a method of forming a semiconductor package includes the following operations. A first integrated circuit structure is provided, wherein the first integrated circuit structure includes a first substrate and a silicon layer over the first substrate. A plasma treatment is performed to transform a top portion of the silicon layer to a first bonding layer on the remaining silicon layer of the first integrated circuit structure. A second integrated circuit structure is provided, wherein the second integrated circuit structure includes a second substrate and a second bonding layer over the second substrate. The second integrated circuit structure is bonded to the first integrated circuit structure through the second bonding layer of the second integrated circuit structure and the first bonding layer of the first integrated circuit structure.

In accordance with alternative embodiments of the present disclosure, a method of forming a semiconductor package includes following operations. A first integrated circuit structure is provided, wherein the first integrated circuit structure includes a logic die and a plurality of memory dies stacked on the logic die. A nitrogen-containing plasma is performed to a first substrate of the logic die, so as to form a first bonding layer in a surface portion of the first substrate of the logic die of the first integrated circuit structure. A second integrated circuit structure is provided, wherein the second integrated circuit structure includes a second substrate and a second bonding layer over the second substrate. The second integrated circuit structure is bonded to the first integrated circuit structure through the second bonding layer of the second integrated circuit structure and the first bonding layer of the first integrated circuit structure.

In accordance with yet alternative embodiments of the present disclosure, a semiconductor package includes a first integrated circuit structure and a second integrated circuit structure. The first integrated circuit structure includes a logic die and a plurality of memory dies stacked on the front side of the logic die. The logic die includes a first substrate, a first through substrate via, and a first bonding layer disposed on a back side of the first substrate and having a gradient nitrogen concentration. The second integrated circuit structure includes a second substrate, a second through substrate via, and a second bonding layer disposed on a back side of the second substrate. The first integrated circuit structure is bonded to the second integrated circuit structure through the first bonding layer and the second bonding layer and through the first through substrate via and the second through substrate via.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, comprising:

providing a first integrated circuit structure, wherein the first integrated circuit structure comprises a first substrate;

performing a nitrogen-containing plasma to a back side of the first substrate, so as to transform a portion of the first substrate into a first bonding layer of the first integrated circuit structure;

providing a second integrated circuit structure, wherein the second integrated circuit structure comprises a second substrate and a second bonding layer over the second substrate; and bonding the second integrated circuit structure to the first integrated circuit structure through the second bonding layer of the second integrated circuit structure and the first bonding layer of the first integrated circuit structure, wherein the first integrated circuit structure further comprises through substrate vias penetrating through the first substrate, and the nitrogen-containing plasma is performed to surface portions of the through substrate vias to form nitridized metal portions.

2. The method of claim 1, wherein the nitrogen-containing plasma comprises $N_2$, $NH_3$, $NH_4$ or a combination thereof.

3. The method of claim 1, wherein a nitrogen amount accounts for more than about 50 vol % of a total gas amount of the nitrogen-containing plasma.

4. The method of claim 1, wherein the nitrogen-containing plasma is diluted by an inert gas.

5. The method of claim 1, wherein the first bonding layer has a first surface bonding to the second bonding layer and a second surface opposite to the first surface, and the second surface is rough and uneven.

6. The method of claim 5, wherein the second surface is rougher than at least a portion of the first surface.

7. The method of claim 1, wherein the nitrogen-containing treatment is performed at a temperature from −20 to 100° C.

8. The method of claim 1, wherein the nitrogen concentration of the first bonding layer is increased towards the second bonding layer of the second integrated circuit structure.

9. The method of claim 1, wherein the first integrated circuit structure further comprises a first device on a front side of the first substrate, and the front side is opposite to the back side.

10. The method of claim 1, wherein the first bonding layer has a surface roughness Rz of about 0.5-5 nm.

11. A method of forming a semiconductor package, comprising:
providing a first integrated circuit structure, wherein the first integrated circuit structure comprises a first die and a plurality of second dies stacked on the first die, wherein the first die comprises a first substrate having a front side and a back side, and the second dies are stacked on the front side of the first substrate;
performing a nitrogen-containing plasma to the back side of the first substrate of the first die, so as to transform a portion of the first substrate of the first die into a first bonding layer;
providing a second integrated circuit structure, wherein the second integrated circuit structure comprises a second substrate and a second bonding layer over the second substrate; and
bonding the second integrated circuit structure to the first integrated circuit structure through the second bonding layer of the second integrated circuit structure and the first bonding layer of the first integrated circuit structure,
wherein the first die further comprises through substrate vias penetrating through the first substrate, and the nitrogen-containing plasma is performed to surface portions of the through substrate vias to form nitridized metal portions.

12. The method of claim 11, wherein the nitrogen-containing plasma comprises $N_2$, $NH_3$, $NH_4$ or a combination thereof.

13. The method of claim 11, wherein the nitrogen-containing plasma comprises a nitrogen content of 50 vol % or more.

14. The method of claim 11, wherein the nitrogen-containing plasma is performed at a temperature from −20 to 100° C.

15. The method of claim 11, wherein the first bonding layer has a first surface bonding to the second bonding layer and a second surface opposite to the first surface, and the second surface is rough and uneven.

16. The method of claim 15, wherein the second surface is rougher than at least a portion of the first surface.

17. A method of forming a semiconductor package, comprising:
providing a first integrated circuit structure, wherein the first integrated circuit structure comprises a logic die and a plurality of memory dies stacked on the logic die, wherein the logic die comprises a first substrate having a front side and a back side, and the memory dies are stacked on the front side of the first substrate;
performing a nitrogen-containing plasma to the back side of the first substrate of the logic die, so as to transform a portion of the first substrate of the logic die into a first bonding layer with a gradient nitrogen concentration;
providing a second integrated circuit structure, wherein the second integrated circuit structure comprises a second substrate and a second bonding layer over the second substrate; and
bonding the second integrated circuit structure to the first integrated circuit structure through the second bonding layer and the first bonding layer,
wherein the logic die further comprises through substrate vias penetrating through the first substrate, and the nitrogen-containing plasma is performed to surface portions of the through substrate vias to form nitridized metal portions.

18. The method of claim 17, wherein the nitrogen-containing plasma comprises $N_2$, $NH_3$, $NH_4$ or a combination thereof.

19. The method of claim 17, wherein the nitrogen concentration of the first bonding layer is increased towards the second bonding layer of the second integrated circuit structure.

20. The method of claim 17, wherein the first bonding layer has a first surface bonding to the second bonding layer and a second surface opposite to the first surface, and the second surface is rough and uneven.

* * * * *